(12) United States Patent
Chen et al.

(10) Patent No.: US 12,300,619 B2
(45) Date of Patent: May 13, 2025

(54) INTERPOSER WITH DIE TO DIE BRIDGE SOLUTION AND METHODS OF FORMING THE SAME

(71) Applicant: Taiwan Semiconductor Manufacturing Company Limited, Hsinchu (TW)

(72) Inventors: Hsien-Wei Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 542 days.

(21) Appl. No.: 17/691,261

(22) Filed: Mar. 10, 2022

(65) Prior Publication Data
US 2023/0040467 A1    Feb. 9, 2023

Related U.S. Application Data

(60) Provisional application No. 63/229,962, filed on Aug. 5, 2021.

(51) Int. Cl.
| | |
|---|---|
| H01L 23/538 | (2006.01) |
| H01L 21/48 | (2006.01) |
| H01L 25/00 | (2006.01) |
| H01L 25/065 | (2023.01) |
| H10D 1/68 | (2025.01) |
| H01L 23/00 | (2006.01) |

(52) U.S. Cl.
CPC ...... *H01L 23/5383* (2013.01); *H01L 21/4857* (2013.01); *H01L 23/5384* (2013.01); *H01L 25/0655* (2013.01); *H01L 25/50* (2013.01); *H10D 1/68* (2025.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01)

(58) Field of Classification Search
CPC ............. H01L 23/5381; H01L 21/4857; H01L 23/5384
See application file for complete search history.

(56) References Cited

U.S. PATENT DOCUMENTS

| | | | | |
|---|---|---|---|---|
| 10,535,608 | B1 * | 1/2020 | Rubin | ..................... H01L 24/17 |
| 2019/0304915 | A1 * | 10/2019 | Jain | ......................... H01L 28/40 |
| 2022/0102280 | A1 * | 3/2022 | Dabral | .................. H01L 21/568 |

* cited by examiner

*Primary Examiner* — Errol V Fernandes
(74) *Attorney, Agent, or Firm* — The Marbury Law Group, PLLC

(57) ABSTRACT

A semiconductor package includes a plurality of inorganic dielectric layers including a plurality of metal interconnect layers formed therein and a plurality of first contact pads, a plurality of organic dielectric layers disposed on and electrically connected to the plurality of inorganic dielectric layers and including a plurality of metal redistribution layers formed therein, wherein the plurality of metal redistribution layers are physically connected to the plurality of first contact pads, and a semiconductor die mounted on the plurality of organic dielectric layers and electrically connected to the plurality of metal redistribution layers through the plurality of metal interconnect layers.

20 Claims, 23 Drawing Sheets

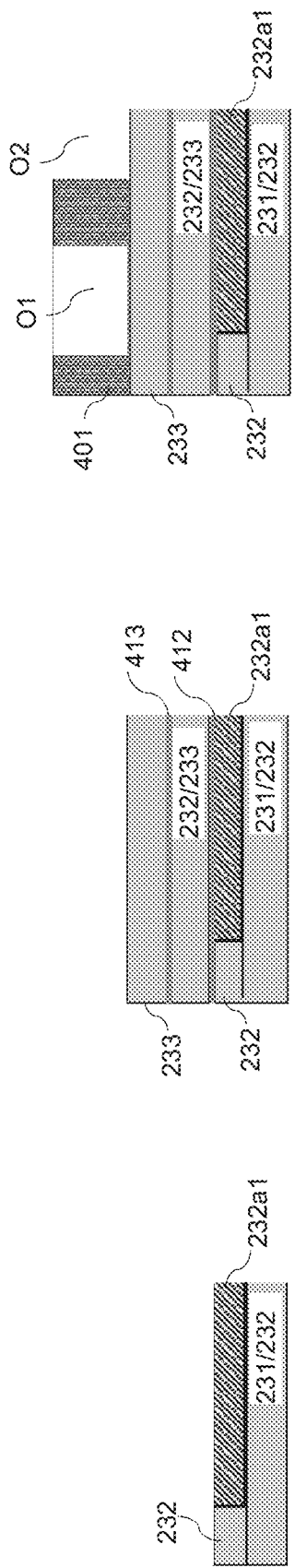
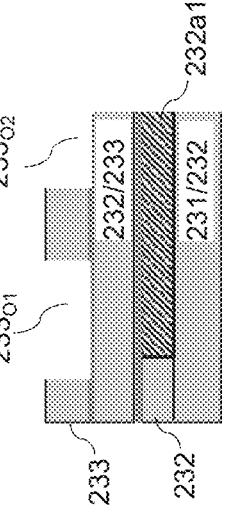
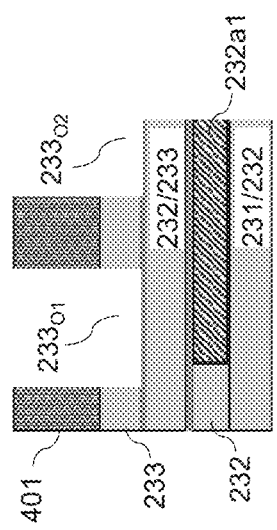
FIG. 4A  FIG. 4B  FIG. 4C  FIG. 4D  FIG. 4E

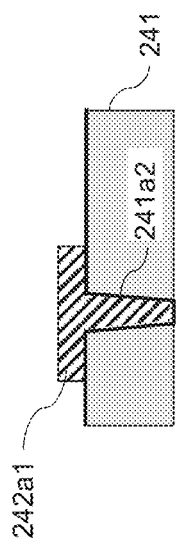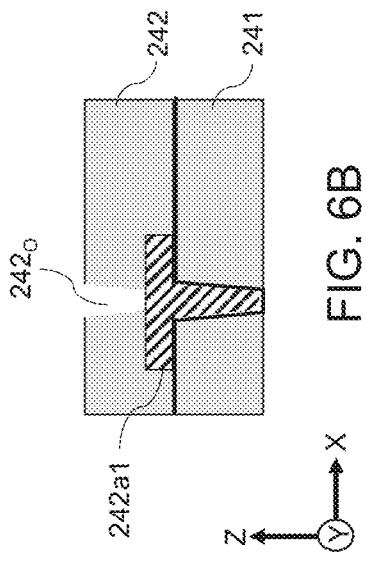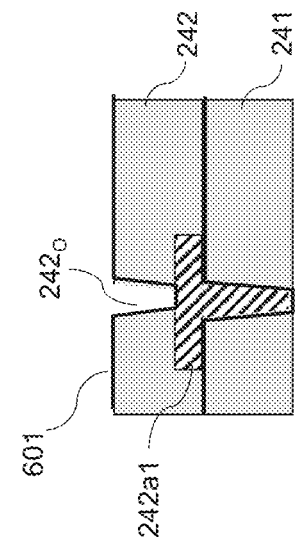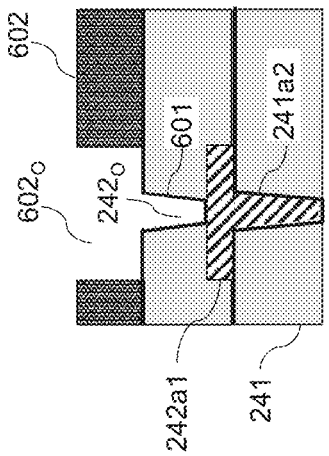

INTERPOSER WITH DIE TO DIE BRIDGE SOLUTION AND METHODS OF FORMING THE SAME

RELATED APPLICATIONS

This application claims the benefit of priority from U.S. Provisional Application No. 63/229,962, entitled "Organic interposer with D2D bridge solution and Methods of Forming the Same" filed on Aug. 5, 2021, the entire contents of which are incorporated herein by reference for all purposes.

BACKGROUND

A redistribution layer (RDL) structure is used for three-dimensional integrated circuit (3DIC) integration, especially for 2.5D IC integration with a passive interposer. The RDL structure may allow for fan-out of the integrated circuit and may allow for lateral communication in the integrated circuit, such as between semiconductor chips mounted on an interposer.

The RDL structure may include, for example, a plurality of metal traces (e.g., metal lines) that may be formed in plurality of organic dielectric layers and connected together by interconnect structures, such as vias and conductive lines. The metal traces in the organic dielectric layers may have a large thickness that makes them good for providing a low RC performance. However, thicker metal traces may impede increased metal routing density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a vertical cross-sectional view of an intermediate structure including the second metal interconnect line, according to one or more embodiments.

FIG. 4B is a vertical cross-sectional view of an intermediate structure including the second inorganic dielectric via layer and third inorganic dielectric layer, according to one or more embodiments.

FIG. 4C is a vertical cross-sectional view of an intermediate structure including a first photoresist layer, according to one or more embodiments.

FIG. 4D is a vertical cross-sectional view of an intermediate structure in which openings are formed in the third inorganic dielectric layer, according to one or more embodiments.

FIG. 4E is a vertical cross-sectional view of an intermediate structure in which the first photoresist layer has been removed, according to one or more embodiments.

FIG. 6A is a vertical cross-sectional view of an intermediate structure including a first metal RDL via and a second metal RDL line, according to one or more embodiments.

FIG. 6B is a vertical cross-sectional view of an intermediate structure including the second organic dielectric layer, according to one or more embodiments.

FIG. 6C is a vertical cross-sectional view of an intermediate structure including a seed layer, according to one or more embodiments FIG. 6D is a vertical cross-sectional view of an intermediate structure including a photoresist layer, according to one or more embodiments.

DETAILED DESCRIPTION

Figure 1:
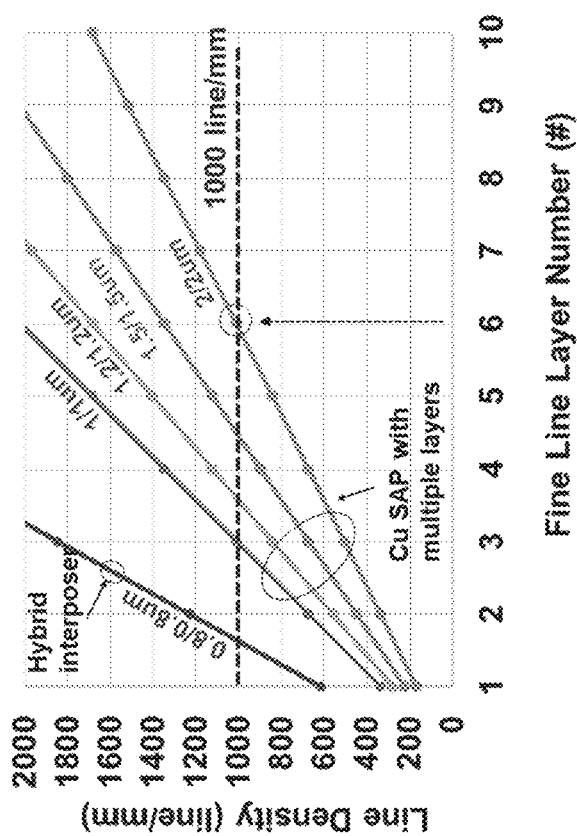
FIG. 1 is a graph that plots line density (line/mm) vs. fine line layer number in an interposer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A typical interposer module may include two or more semiconductor dies mounted on an organic interposer. The organic interposer may include a plurality of organic layers (e.g., polyimide polymer layers) that may be formed using a semi-additive process (SAP), and metal (e.g., copper) lines in the plurality of organic layers (e.g., SAP RDL fine pitch process). Typically, a thicker SAP copper (Cu) RDL may be good for low RC performance, but multiple layers (e.g., six layers or more) may be needed for die-to-die communication (e.g., communication between two semiconductor dies mounted on the interposer).

An embodiment of the present invention may include a hybrid interposer. The hybrid interposer may include a plurality of inorganic dielectric layers (e.g., dielectric layers having a k value of approximately 3.3) and a plurality of organic dielectric layers on the plurality of inorganic dielectric layers (e.g., k=3.9). Two or more semiconductor dies mounted on the hybrid interposer may be coupled together by one or more metal interconnect layers that may be formed in the plurality of inorganic dielectric layers. That is, the semiconductor dies mounted on the hybrid interposer may be connected to one another by using an embedded copper interconnect that may be formed, for example, by a copper chemical mechanical polishing (CMP) damascene or dual damascene process. The hybrid interposer may, therefore, combine the benefit of an organic interposer (e.g., thick copper lines, thick polymer layers, and low RC performance) with the benefit of an inorganic interposer (e.g., high metal routing density for die-to-die input/output (I/O) communication).

FIG. 1 is a graph that plots line density (line/mm) vs. fine line layer number in an interposer. A fine pitch metal routing may be needed for die-to-die I/O communication. As illustrated in FIG. 1, for a line density of about 1000 lines/mm, the interposer implemented in various embodiments disclosed herein (e.g., a hybrid interposer) having a width-to-space (W/S) of about 1.0/1.0 μm (such as a W/S of 0.8/0.8 μm) may need a range of one to three layers (e.g., only two layers), whereas an organic interposer with a W/S of about 2/2 μm may need a range of five to seven layers (e.g., six layers). The interposer implemented in various embodiments disclosed herein may, therefore, provide a die-to-die bridge solution that is not provided by a typical organic interposer.

In one or more embodiments, the interposer may include stack vias and non-stack vias. The stack vias may be formed below two adjacent top dies and the copper bridge may be formed on fine pitch copper damascene layers. The interconnect (e.g., back end of line (BEOL) interconnect) may include a copper interconnect that may be embedded in the inorganic dielectric layers (e.g., $SiO_2$, SiC, Low-k dielectric material, etc.). The interconnect may provide for copper damascene fine pitch routing (e.g., ≤0.8/0.8 μm). The SAP RDL may be processed after the copper interconnect layers. The SAP RDL may have a thickness in a range of 1 μm to 5 μm and have a minimum W/S of about 1.5/1.5 μm. The interposer may not necessarily include through silicon vias that may cause a resistance issue (e.g., IR loss issue).

One or more embodiments may include a semiconductor package including an interposer module that includes the hybrid interposer. The semiconductor package including the interposer module may be formed, for example, by a method that includes forming the copper interconnect (e.g., inorganic dielectric layers) on silicon. A damascene or dual damascene process may be used to form the interconnect in the inorganic dielectric layers. For example, in one or more embodiments, in a copper dual damascene process the copper may have a thickness in a range from 1 μm to 3 μm (e.g., about 2 μm), a dielectric via may have a thickness in a range from 0.5 μm to 0.7 μm (e.g., about 0.6 μm), and a minimum W/S may be about 0.4/0.4 μm. The SAP RDL (e.g., organic dielectric layers) may be formed on the inorganic layers. For example, in an SAP process a thickness of the copper layer may be in a range of 1.5 μm to 3 μm, a polymer via may have a thickness of about 5 μm and a minimum W/S may be about 1.5/1.5 μm.

In one or more embodiments, semiconductor dies may be mounted on the SAP RDL by a pick-and-place (PNP)/reflow operation in which the under bump metallurgy (UBM) may include, for example, Cu/Ni/Cu/Sn: 8/5/4/7. A molding material may be formed (e.g., by a molding process/molding compound grinding process (MD/MCG)) on the semiconductor dies (UBM Cu/Ni/Cu/Sn: 8/5/4/7; stand of height (SOH): 45 μm; Mold: 297; from about 90 μm to about 40 μm). A glass layer may be bonded to a surface of the molding material. The device may be inverted and the silicon removed. Copper bumps (e.g., C4 bumps; Cn/Sn: 40/30) may be formed on the bottom of the inorganic dielectric layers. The glass layer may be removed and a ball grid (BG) tape may be laminated on the copper bumps. A second grinding process may be performed on the molding material. The device may be inverted again, mounted on a frame, and separated by sawing or dicing. The device may be mounted on a substrate using the copper bumps.

Another embodiment of the present invention may include a semiconductor package including an interposer module that includes two or more semiconductor dies mounted on the copper interconnect layers (i.e., on the inorganic dielectric layers) with no organic dielectric layers. Another embodiment may include the hybrid interposer with a super high density metal-insulator-metal (SHDMiM) capacitor formed in a passivation layer of the inorganic dielectric layers.

Figure 2A:
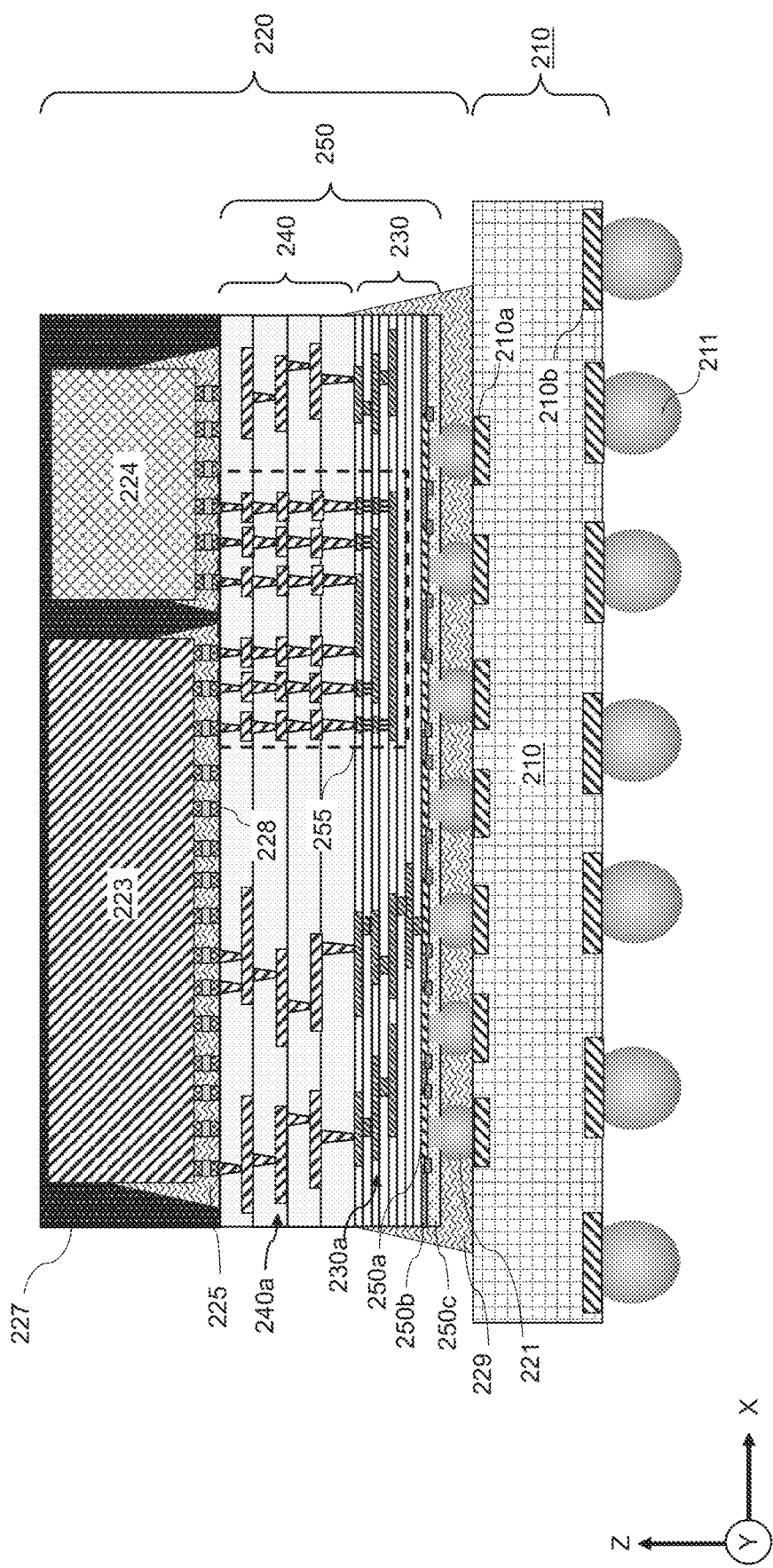
FIG. 2A is a vertical cross-sectional view of a semiconductor package including an interposer module, according to one or more embodiments.

Referring again to the drawings, FIG. 2A is a vertical cross-sectional view of a semiconductor package including an interposer module 220 according to one or more embodiments. As illustrated in FIG. 2A, the interposer module 220 may be mounted on a package substrate 210. The interposer module 220 and package substrate may constitute, for example, a semiconductor package or package assembly. A package lid may also be formed over the interposer module 220 and attached to the package substrate 210 to form a semiconductor package.

The package substrate 210 may include, for example, a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. The package substrate 210 may also include metal interconnects and through vias to provide an electrical connection of the package substrate 210. In particular, the package substrate 210 may include metal bonding pads 210a formed on the one side of the package substrate 210 (e.g., a chip-side of the package substrate). The metal bonding pads 210a may provide an electrical connection to a device (e.g., interposer module, semiconductor die, etc.) that is mounted on the package substrate 210.

The package substrate 210 may also include metal bonding pads 210b formed on the opposing side of the package substrate 210 (e.g., a board-side of the package substrate 210). The metal bonding pads 210b may provide an electrical connection to a substrate such as a printed circuit board (PCB) on which the package substrate 210 may be mounted. A ball-grid array (BGA) including a plurality of solder balls 211 may be formed on the metal bonding pads 210b. The solder balls 211 may allow the package substrate 210 to be securely mounted on the substrate. The solder balls 211 may be electrically connected to the metal bonding pads 210a through the metal bonding pads 210b and the various vias and interconnects in the package substrate 210.

The interposer module 220 may include an interposer 250 (e.g., interposer dielectric layer). A plurality of metal bonding pads 250a may be formed on a package substrate side of the interposer 250 to facilitate an electrical connection to the package substrate 210. The metal bonding pads 250a may include a metal such as aluminum or other suitable conductive materials (e.g., copper). A passivation layer 250b may be formed around the metal bonding pads 250a. The passivation layer may include, for example, silicon oxide, silicon nitride, low-k dielectric materials such as carbon-doped oxides, extremely low-k dielectric materials such as porous carbon doped silicon dioxide, a combination thereof or other suitable material. A protection layer 250c may be formed on the passivation layer 250b and the metal bonding pads 250a. The protection layer 250c may include, for example, polybenzoxazole (PBO), polyimide, benzocyclobutene (BCB), or other suitable dielectric material.

A plurality of C4 bumps 221 may be formed on the plurality of metal bonding pads 250a through recessed portions of the protection layer 250c. The interposer module 220 may be mounted on the substrate 210 by bonding the C4 bumps to the metal bonding pads 210a in the package substrate 210. A package underfill layer 229 may be formed on the package substrate 210 and under and around the interposer module 220 and the C4 bumps 221 so as to adhere the interposer module 220 to the package substrate 210. A package underfill layer 229 may be formed of an epoxy-based polymeric material. The package underfill layer 229 may be formed around and under a plurality of inorganic dielectric layers 230 and a plurality of organic dielectric layers 240 of the interposer 250.

The interposer 250 may include the plurality of inorganic dielectric layers 230. The plurality of inorganic dielectric layers 230 may be formed, for example, of $SiO_2$, SiC, or other low-k dielectric materials, etc. Other suitable materials are within the contemplated scope of disclosure. A plurality of metal interconnect layers 230a (e.g., metal interconnect lines and metal interconnect vias) may be formed in the plurality of inorganic dielectric layers 230. The plurality of metal interconnect layers 230a may include copper and/or another material such as Al, Mo, Co, Ru, W, TiN, TaN, WN, or a combination or a stack thereof. Other suitable materials are within the contemplated scope of disclosure. For example, each of the metal interconnect layers 230a may include a layer stack of a TiN layer and a Cu layer. The plurality of metal interconnect layers 230a may be connected to the plurality of metal bonding pads 250a using a series of metal lines and vias.

The interposer 250 may also include a plurality of organic dielectric layers 240 on the plurality of inorganic dielectric layers 230. The plurality of organic dielectric layers 240 may include, for example, polyimide (PI), benzocyclobutene (BCB), or polybenzobisoxazole (PBO). Other suitable materials are within the contemplated scope of disclosure. A plurality of metal RDL layers 240a (e.g., metal RDL lines and metal RDL vias) may be formed in the plurality of organic dielectric layers 240. The plurality of metal RDL layers 240a may also include copper and/or another material such as Al, Mo, Co, Ru, W, TiN, TaN, WN, or a combination or a stack thereof. Other suitable materials are within the contemplated scope of disclosure. For example, each of the metal RDL layers 240a may include a layer stack of a TiN layer and a Cu layer. The plurality of metal RDL layers 240a may be connected to the plurality of metal interconnect layers 230a.

The interposer module 220 may also include a first semiconductor die 223 (e.g., first system on chip (SOC) die) mounted on the interposer 250, and a second semiconductor die 224 (e.g., second system on chip (SOC) die) mounted on the interposer 250. The first semiconductor die 223 and second semiconductor die 224 may be mounted on the interposer 250 using micro-bump structures 228 that may be electrically connected to the metal RDL layers 240a.

An interposer underfill layer 225 may be formed on the plurality of organic dielectric layers 240, under and around the first semiconductor die 223 and the second semiconductor die 224 and around the micro-bump structures 228. The interposer underfill layer 225 may be formed separately around each of the first semiconductor die 223 and the second semiconductor die 224, or continuously around both the first semiconductor die 223 and the second semiconductor die 224. The interposer underfill layer 225 may fix the first semiconductor die 223 and second semiconductor die 224 to the interposer 250. The interposer underfill layer 225 may also be formed of an epoxy-based polymeric material.

The first semiconductor die 223 and the second semiconductor die 224 may each include, for example, a system assembly such as an SOC assembly, a system on integrated chip (SoIC) assembly, or a semiconductor chip such as a high-bandwidth memory (HBM) chip. In particular, the interposer module 220 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

A molding material layer 227 may be formed over the first semiconductor die 223 and the second semiconductor die 224. The molding material layer 227 may securely fix the first semiconductor die 223 and the second semiconductor die 224 to the interposer 250. The molding material layer 227 may contact, for example, an upper surface of the interposer 250. The molding material layer 227 may also be formed on and around the interposer underfill layer 225. The molding material layer 227 may also be formed of an epoxy molding compound (EMC).

As illustrated in FIG. 2A, the interposer 250 may include a die-to-die bridge 255 for connecting the first semiconductor die 223 and the second semiconductor die 224. The die-to-die bridge 255 may include one or more of the metal interconnect layers 230a in the plurality of inorganic dielectric layers 230 and one or more of the metal RDL layers 240a in the plurality of organic dielectric layers 240. The metal interconnect layers 230a in the plurality of inorganic dielectric layers 230 may provide the die-to-die bridge 255 with a fine pitch metal routing that may help to facilitate die-to-die communication (e.g., die-to-die I/O communication) between the first semiconductor die 223 and the second semiconductor die 224.

Further, although only one die-to-die bridge 255 is illustrated in FIG. 2A, the interposer module 220 may include a plurality of die-to-die bridges 255. In particular, a plurality of die-to-die bridges 255 may be formed along the length of the first semiconductor die 223 and the length of the second semiconductor die 224 in the y-direction in FIG. 2A. Thus, for example, a plurality of die-to-die bridges 255 may connect the first semiconductor die 223 to the second semiconductor die 224 over the length of the interposer module 220 in the y-direction.

Figure 2B:
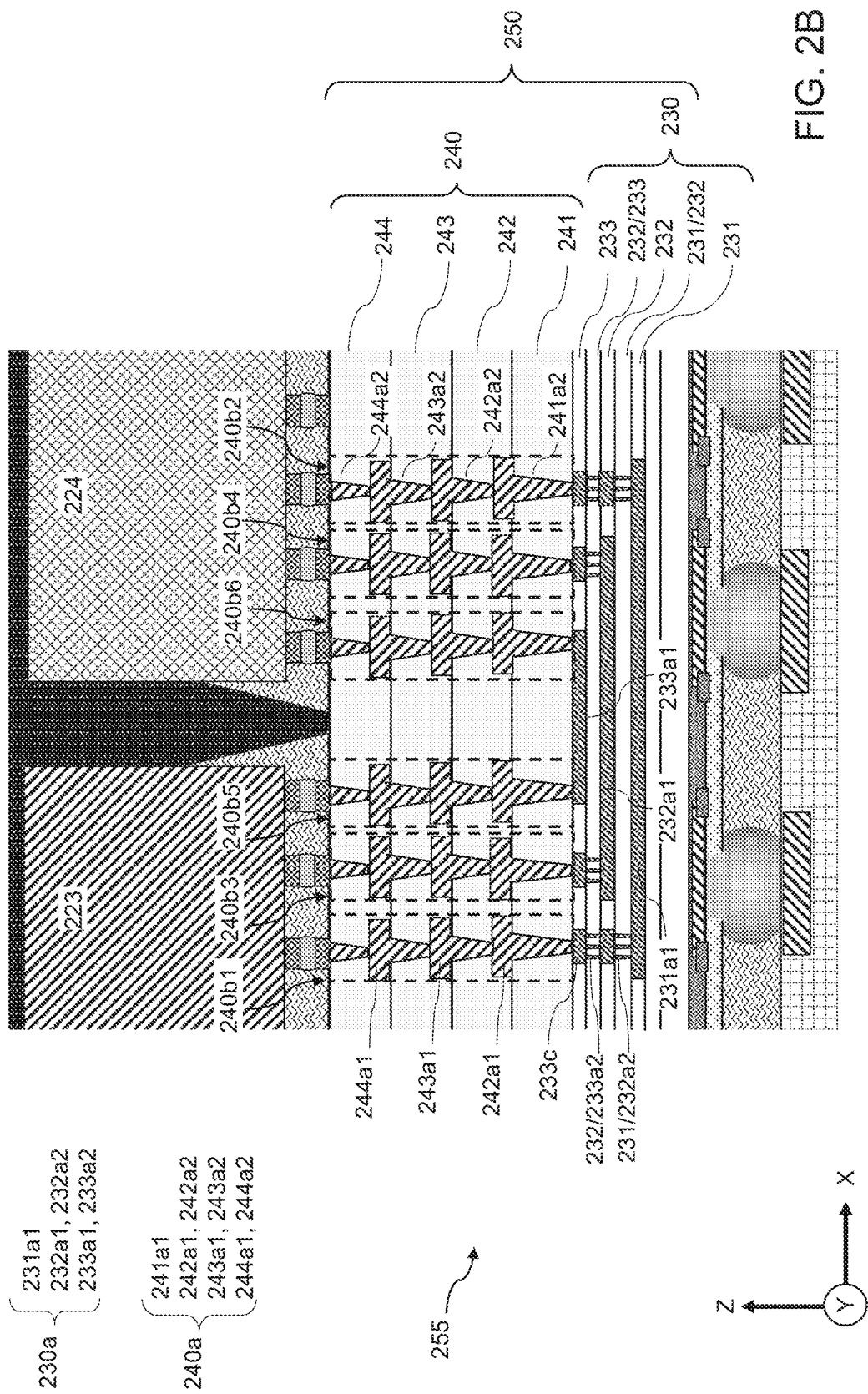
FIG. 2B is a vertical cross-sectional view of the die-to-die bridge in the interposer, according to one or more embodiments.

FIG. 2B is a vertical cross-sectional view of the die-to-die bridge 255 in the interposer 250, according to one or more embodiments. As illustrated in FIG. 2B, the plurality of inorganic dielectric layers 230 may include a first inorganic dielectric layer 231, first inorganic dielectric via layer 231/232, second inorganic dielectric layer 232, second inorganic dielectric via layer 232/233, and third inorganic dielectric layer 233. The plurality of metal interconnect layers 230a may include first metal interconnect line 231a1, first metal interconnect vias 231/232a2, second metal interconnect line 232a1, second metal interconnect vias 232/233a2 and third metal interconnect line 233a1. The first metal interconnect line 231a1 may be formed in the first inorganic dielectric layer 231. The first metal interconnect vias 231/232a2 may be formed in the first inorganic dielectric via layer 231/232. The second metal interconnect line 232a1 may be formed in the second inorganic dielectric layer 232. The second metal interconnect vias 232/233a2 may be formed in the second inorganic dielectric via layer 232/233. The third metal interconnect line 233a1 may be formed in the third inorganic dielectric layer 233. The third metal interconnect line 233a1 may also serve as a first contact pad for providing a physical and electrical connection to the plurality of inorganic dielectric layers 230. Additional first contact pads 233c may be formed in the third inorganic dielectric layer 233 from the same metal material as the third metal interconnect line 233a1.

The plurality of organic dielectric layers 240 may include a first organic dielectric layer 241, second organic dielectric layer 242, third organic dielectric layer 243 and fourth organic dielectric layer 244. The plurality of metal RDL layers 240a may include first metal RDL vias 241a2, second metal RDL lines 242a1 and second metal RDL vias 242a2, third metal RDL lines 243a1 and third metal RDL vias 243a2 and fourth metal RDL lines 244a1 and fourth metal RDL vias 244a2.

As illustrated in FIG. 2B, in the die-to-die bridge 255, each of the first metal interconnect line 231a1, second metal interconnect line 232a1 and third metal interconnect line 233a1 may extend in the x-direction from a region below the first semiconductor die 223 to a region below the second semiconductor die 224. The first metal interconnect line 231a1 may have a length in the x-direction that is greater than a length in the x-direction of the second metal interconnect line 232a1. The second metal interconnect line 232a1 may have a length in the x-direction that is greater than a length in the x-direction of the third metal interconnect line 233a1. Further, a center point of each the first metal interconnect line 231a1, second metal interconnect line 232a1 and third metal interconnect line 233a1 may be substantially aligned in the x-direction.

As further illustrated in FIG. 2B, the first metal RDL vias 241a2, second metal RDL vias 242a2, third metal RDL vias 243a2, and fourth metal RDL vias 244a2, may be arranged in metal RDL via stacks 240b1-240b6. Each of the metal RDL via stacks 240b1-240b6 may extend in the z-direction below the first semiconductor die 223 or below the second semiconductor die 224. Each of the metal RDL via stacks 240b1-240b6 may include one of the first metal RDL vias 241a2, one of the second metal RDL vias 242a2, one of the third metal RDL vias 243a2 and one of the fourth metal RDL vias 244a2 that are connected together and substantially aligned in the z-direction.

The first metal RDL via stack 240b1 and second metal RDL via stack 240b2 may be connected through the first metal interconnect vias 231/232a2 and second metal interconnect vias 232/233a2 to opposing ends of the first metal interconnect line 231a1. The third metal RDL via stack 240b3 and fourth metal RDL via stack 240b4 may be connected through the second metal interconnect vias 232/233a2 to opposing ends of the second metal interconnect line 232a1. The fifth metal RDL via stack 240b5 and sixth metal RDL via stack 240b6 may be connected (e.g., directly connected) to opposing ends of the third metal interconnect line 233a1.

Figure 2C:
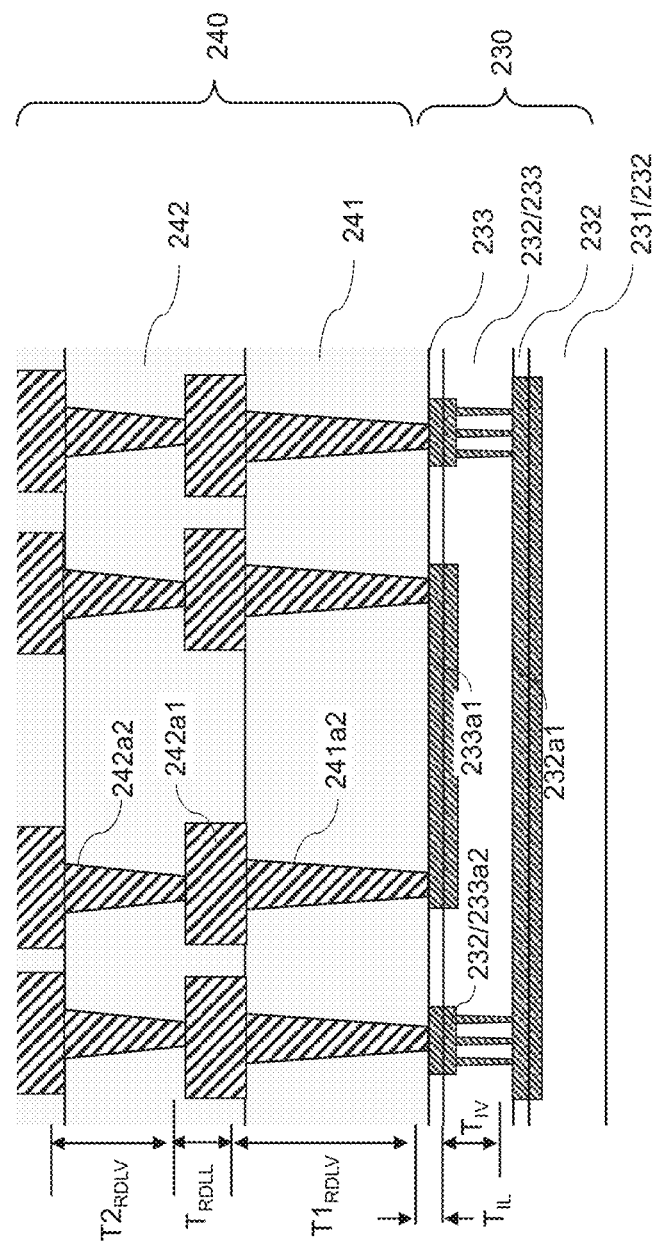
FIG. 2C is a vertical cross-sectional view of an interface between the plurality of inorganic dielectric layers and the plurality of organic dielectric layers in the die-to-die bridge, according to one or more embodiments.

FIG. 2C is a vertical cross-sectional view of an interface between the plurality of inorganic dielectric layers 230 and the plurality of organic dielectric layers 240 in the die-to-die bridge 255, according to one or more embodiments.

Each of the plurality of inorganic dielectric layers 230 may have a thickness, for example, in a range from 3 μm to 5 μm. The plurality of metal interconnect layers 230a may have a damascene structure. That is, the plurality of metal interconnect layers 230a may be formed in the plurality of inorganic dielectric layers 230, for example, by a damascene or dual damascene process. A minimum W/S of the plurality of metal interconnect layers 230a may be about 0.4/0.4 μm. A thickness $T_{IL}$ of the first metal interconnect line 231a1 (not shown), second metal interconnect line 232a1 and third metal interconnect line 233a1, may be in a range from 0.5 μm to 2 μm. A thickness $T_{IV}$ of the first metal interconnect vias 231/232a2 (not shown) and second metal interconnect vias 232/233a2 may be in a range from 0.2 μm to 1 μm.

Each of the plurality of organic dielectric layers 240 may have a thickness, for example, in a range from 5 μm to 10 μm. The plurality of metal RDL layers 240a may be formed in the plurality of organic dielectric layers 240, for example, by an SAP process. A minimum W/S of the plurality of metal RDL layers 240a may be 1.5/1.5 μm. A thickness $T_{RDLL}$ of the second metal RDL lines 242a1, third metal RDL lines 243a1 and fourth metal RDL lines 244a1 may be in a range from 1.5 μm to 3 μm. A thickness $T1_{RDLV}$ of the first metal RDL via 242a2 may be in a range from 5 μto 10 μm (e.g., the same thickness as the organic dielectric layers 240). A thickness $T2_{RDLV}$ of the second metal RDL via 242a2, third metal RDL via 243a2 and fourth metal RDL via 244a2 may be less than a thickness $T1_{RDLV}$ and in a range from 3 μm to 5 μm.

FIGS. 3-17 illustrate a method of making an interposer module 220, according to one or more embodiments.

Figure 3:
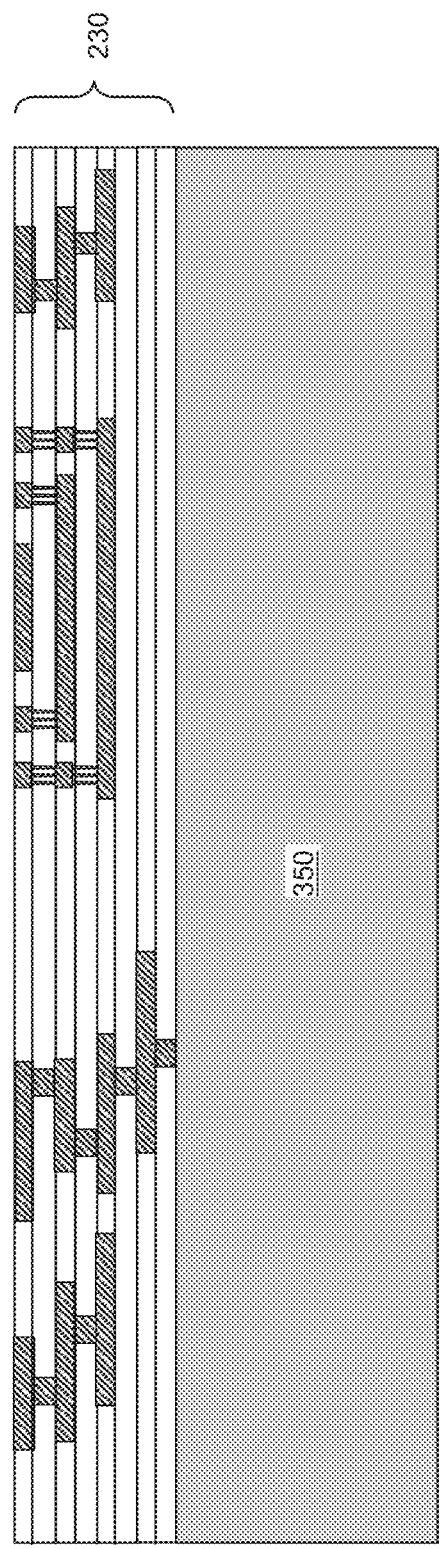
FIG. 3 is a vertical cross-sectional view of an intermediate structure in which the plurality of inorganic dielectric layers are formed on a silicon substrate, according to one or more embodiments.

FIG. 3 is a vertical cross-sectional view of an intermediate structure in which the plurality of inorganic dielectric layers 230 may be formed on a silicon substrate 350, according to one or more embodiments. The silicon substrate 350 may include, for example, a carrier substrate, silicon wafer, etc. The inorganic dielectric layers 230 may be formed on the silicon substrate 350, for example, by chemical vapor deposition (CVD), physical vapor deposition (PVD), spin coating, lamination or other suitable deposition technique. In one or more embodiments, the inorganic dielectric layers 230 may be composed of $SiO_2$ that may be deposited by plasma enhanced chemical vapor deposition (PECVD).

As noted above, the plurality of metal interconnect layers 230a may be formed in the plurality of inorganic dielectric layers 230 by a damascene or dual damascene process. In such damascene or dual damascene processes, the underlying dielectric layers may be patterned with open trenches where the metal interconnect layers 230a are to be formed. A thick coating of copper or other suitable metal fill material that overfills the trenches may be deposited on the insulator. A chemical-mechanical planarization (CMP) may be used to remove the copper or other suitable metal fill material (known as overburden) that extends above the top of the insulating layer. Copper or other suitable metal fill material sunken within the trenches of the dielectric layer is not removed and becomes the patterned metal interconnect. Damascene processes generally form and fill a single feature with copper or other suitable metal fill material per Damascene stage. Dual-Damascene processes generally form and fill two features with copper or other suitable metal fill material at once, e.g., a trench overlying a via may both be filled with a single copper or other suitable metal fill material deposition using dual-Damascene.

With successive layers of dielectric and copper (or other suitable metal fill material), a multilayer metal interconnect structure may be formed. The number of layers comprising the multilayer metal interconnect structure may depend on the multilayer metal interconnect structure function.

FIGS. 4A-4J illustrate an exemplary method of making the plurality of metal interconnect layers 230a used in an interposer module 220, according to one or more embodiments. In particular, FIGS. 4A-4J illustrate the forming of the second metal interconnect line 232a1, the second metal interconnect via 232/233a2, and the third metal interconnect line 233a1. However, the same method or a similar method may be used to form the remainder of the plurality of metal interconnect layers 230a. The method illustrated in FIGS. 4A-4J is a dual damascene method, but other suitable methods are contemplated.

FIG. 4A is a vertical cross-sectional view of an intermediate structure including the second metal interconnect line 232a1 formed in a dielectric layer 232 of a plurality of inorganic dielectric layers 230 used in an interposer module 220, according to one or more embodiments. The first inorganic dielectric via layer 231/232 may be formed, for example, by CVD (e.g., PECVD), PVD, spin coating, lamination or other suitable deposition technique. A first etch stop layer such as SiN (not shown) may be formed on the first inorganic dielectric via layer 231/232. The second inorganic dielectric layer 232 may be formed on the first inorganic dielectric via layer 231/232. The second inorganic dielectric layer 232 may also be formed, for example, by CVD (e.g., PECVD), PVD, spin coating, lamination or other suitable deposition technique.

A recess or trench may be formed in the second inorganic dielectric layer 232. The forming of the recess or trench in the second inorganic dielectric layer 232 may be performed, for example, by using a photolithographic process. The photolithographic process may include forming a patterned photoresist mask (not shown) on the second inorganic dielectric layer 232, and etching (e.g., wet etching, dry etching, etc.) the exposed upper surface of the second inorganic dielectric layer 232 through openings in the photoresist mask. In one or more embodiments, the etching may be performed by reactive ion etching (RIE). The photoresist mask may be subsequently removed by ashing, dissolving the photoresist mask or by consuming the photoresist mask during the etch process.

One or more metal layers may be deposited in the recess or trench and on a surface of the second inorganic dielectric layer 232. The one or more metal layers may include copper and/or another material such as Al, Mo, Co, Ru, W, TiN, TaN, WN, or a combination or a stack thereof. Other suitable materials are within the contemplated scope of disclosure. For example, a TiN layer may be deposited and a layer of copper may be deposited on the TiN layer. The metal layers may be deposited, for example, by CVD, PVD, spin coating, lamination or other suitable deposition technique. A chemical mechanical polishing (CMP) process may be performed to planarize a surface of the second inorganic dielectric layer 232 and a surface of the second metal interconnect line 232a1 that has been formed in the recess.

FIG. 4B is a vertical cross-sectional view of an intermediate structure including the second inorganic dielectric via layer 232/233 and third inorganic dielectric layer of a plurality of inorganic dielectric layers 230 used in an interposer module 220, according to one or more embodiments. A second etch stop layer 412 may be formed on the surface of the second inorganic dielectric layer 232 and the surface of the second metal interconnect line 232a1. The second inorganic dielectric via layer 232/233 may be deposited on the second etch stop layer 412. A third etch stop layer 413 may be formed on the second inorganic dielectric via layer 232/233, and the third inorganic dielectric layer 233 may be deposited on the third etch stop layer 413. Both the second inorganic dielectric via layer 232/233 and the third inorganic dielectric layer 233 may be formed by CVD (e.g., PECVD), PVD, spin coating, lamination or other suitable deposition technique.

FIG. 4C is a vertical cross-sectional view of an intermediate structure including a first photoresist layer 401, according to one or more embodiments. The first photoresist layer 401 may be formed on the third inorganic dielectric layer 233, and patterned by a photolithographic process to form openings O1 and O2 in the first photoresist layer 401.

FIG. 4D is a vertical cross-sectional view of an intermediate structure in which opening $233_{O1}$ and $233_{O2}$ may be formed in the third inorganic dielectric layer 233 of a plurality of inorganic dielectric layers 230 used in an interposer module 220, according to one or more embodiments. The openings $233_{O1}$ and $233_{O2}$ may be formed by performing an etching process (e.g., wet etching, dry etching) to transfer the pattern of the first photoresist layer 401 into the third inorganic dielectric layer 233. In one or more embodiments, the etching may be performed by reactive ion etching (RIE).

FIG. 4E is a vertical cross-sectional view of an intermediate structure in which the first photoresist layer 401 has been removed, according to one or more embodiments. The first photoresist layer 401 may be removed, for example, by ashing, dissolving the first photoresist layer 401 or by consuming the first photoresist layer 401 during the etch process.

Figure 4F:
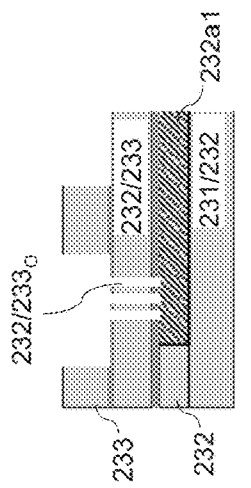
FIG. 4F is a vertical cross-sectional view of an intermediate structure including a second photoresist layer, according to one or more embodiments.

FIG. 4F is a vertical cross-sectional view of an intermediate structure including a second photoresist layer 402, according to one or more embodiments. As illustrated in FIG. 4F, the second photoresist layer 402 may be formed in the openings $233_{O1}$ and $233_{O2}$ in the third inorganic dielectric layer 233. The second photo resist layer 402 may include one or more openings $O_3$ that are located in the opening $233_{O1}$ of the third inorganic dielectric layer 233.

Figure 4G:
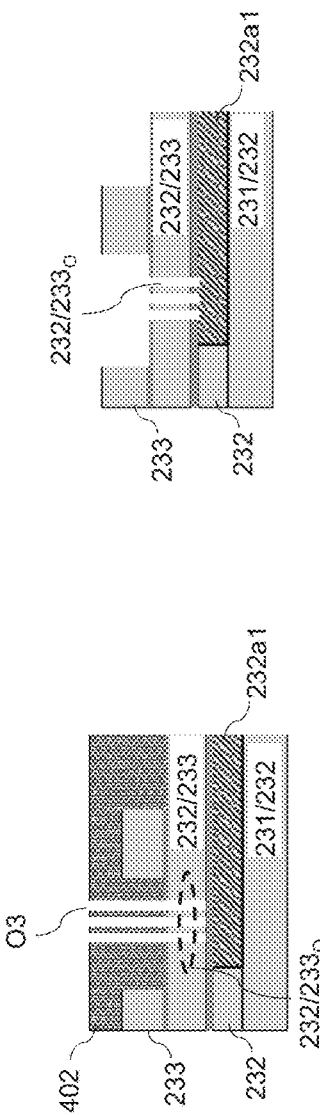
FIG. 4G is a vertical cross-sectional view of an intermediate structure including openings in the second inorganic dielectric via layer, according to one or more embodiments.

FIG. 4G is a vertical cross-sectional view of an intermediate structure including openings $232/233_O$ in the second inorganic dielectric via layer 232/233 of a plurality of inorganic dielectric layers 230 used in an interposer module 220, according to one or more embodiments. The openings $232/233_O$ may be formed by performing an etching process (e.g., wet etching, dry etching) to transfer the pattern of the second photoresist layer 402 into the second inorganic dielectric via layer 232/233. In one or more embodiments, the etching may be performed by reactive ion etching (RIE). The openings $232/233_O$ may expose an upper surface of the second metal interconnect line 232a1.

Figure 4H:
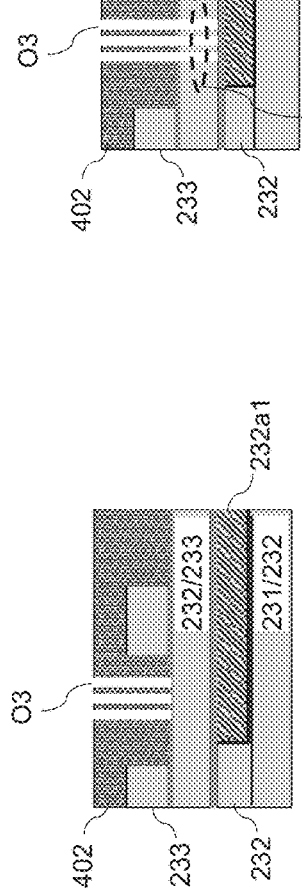
FIG. 4H is a vertical cross-sectional view of an intermediate structure in which the second photoresist layer has been removed, according to one or more embodiments.

FIG. 4H is a vertical cross-sectional view of an intermediate structure in which the second photoresist layer 402 has been removed, according to one or more embodiments. The second photoresist layer 402 may be removed from the openings $233_{O1}$ and $233_{O2}$ in the third inorganic dielectric layer 233. The second photoresist layer 402 may be removed, for example, by ashing, dissolving the second photoresist layer 402 or by consuming the second photoresist layer 402 during the etch process.

Figure 4I:
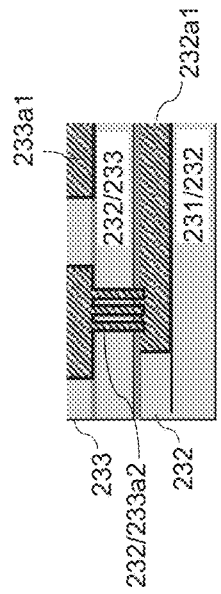
FIG. 4I is a vertical cross-sectional view of an intermediate structure including a metal material layer, according to one or more embodiments.

FIG. 4I is a vertical cross-sectional view of an intermediate structure including a metal material layer 233aL formed in and over a dielectric layer 233 of a plurality of inorganic dielectric layers 230 used in an interposer module 220, according to one or more embodiments. The metal material layer 233aL may be deposited on the third inorganic dielectric layer 233 and in the openings $233_{O1}$ and $233_{O2}$ in the third inorganic dielectric layer 233. The metal material layer 233aL may also be formed in the openings $232/233_O$ in the second inorganic dielectric via layer 232/233 and contact the upper surface of the second metal interconnect line 232a1. The metal material layer 233aL may include copper and/or another material such as Al, Mo, Co, Ru, W, TiN, TaN, WN, or a combination or a stack thereof. Other suitable materials are within the contemplated scope of disclosure. For example, a TiN layer may be deposited and a layer of copper may be deposited on the TiN layer. The metal material layer 233aL may be deposited, for example, by CVD, PVD, spin coating, lamination or other suitable deposition technique.

Figure 4J:
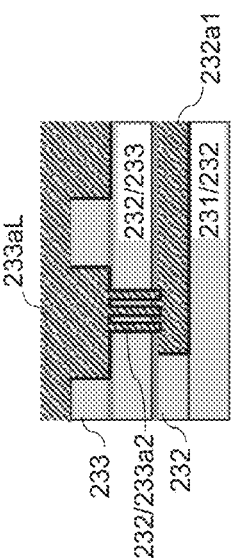
FIG. 4J is a vertical cross-sectional view of an intermediate structure in which the metal material layer has been planarized, according to one or more embodiments.

FIG. 4J is a vertical cross-sectional view of an intermediate structure in which the metal material layer 233aL has been planarized, according to one or more embodiments. A chemical mechanical polishing (CMP) process may be performed to planarize a surface of the third inorganic dielectric layer 233 and a surface of the third metal interconnect line 233a1 that has been formed in the opening $233_{O2}$ in the third inorganic dielectric layer 233.

Figure 5:
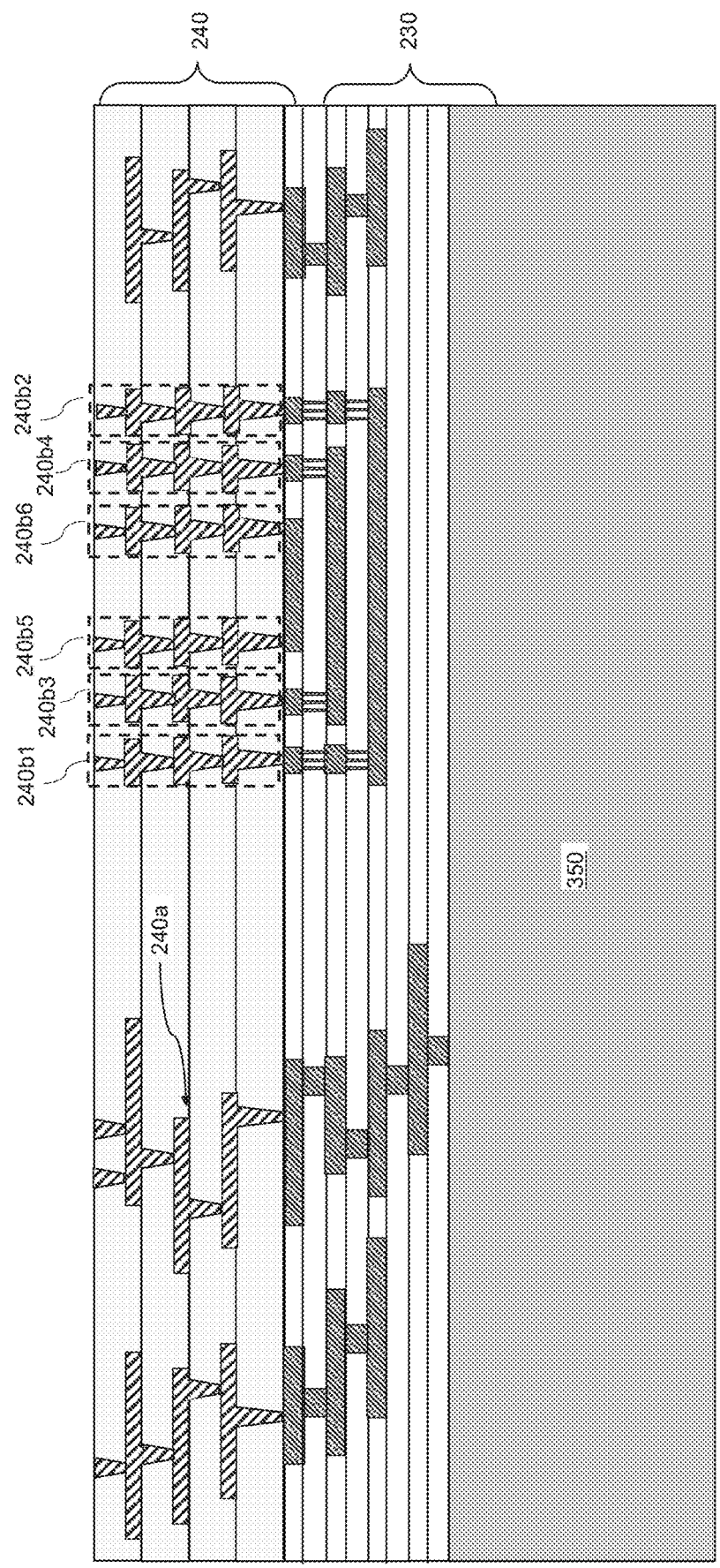
FIG. 5 is a vertical cross-sectional view of an intermediate structure including the plurality of organic dielectric layers, according to one or more embodiments.

FIG. 5 is a vertical cross-sectional view of an intermediate structure including the plurality of organic dielectric layers 240, according to one or more embodiments. As noted above, the organic dielectric layers 240 may be formed of a dielectric polymer material such as polyimide (PI), benzocyclobutene (BCB), or polybenzobisoxazole (PBO). Other suitable materials are within the contemplated scope of disclosure. The organic dielectric layers 240 may be formed on the inorganic dielectric layers 230, for example, by chemical vapor deposition (CVD), physical vapor deposition (PVD), spin coating, lamination or other suitable deposition technique. The plurality of metal RDL layers 240a may be formed in the plurality of inorganic dielectric layers 240 by an SAP process. The plurality of metal RDL layers 240a includes the metal RDL via stacks 240b1-240b6 that are part of the die-to-die bridge 255 that may be subsequently used to connect a first semiconductor die 223 to a second semiconductor die 224 (e.g., see FIG. 2A).

FIGS. 6A-6E illustrate an exemplary method of making the plurality of metal RDL layers 240a formed in and over a plurality of organic dielectric layers 240 used in an interposer module 220, according to one or more embodiments. In particular, FIGS. 6A-6D illustrate the forming of a second metal RDL via 242a2 and a third metal RDL line 243a1 that may be included in one of the metal RDL via stacks 240b1-240b6 formed in and over a plurality of organic dielectric layers 240 used in an interposer module 220. However, the same method or a similar method may be used to form the remainder of the plurality of metal RDL layers 240a. The method illustrated in FIGS. 6A-6E may include an SAP process, but other suitable methods are contemplated.

FIG. 6A is a vertical cross-sectional view of an intermediate structure including a first metal RDL via 241a2 and a second metal RDL line 242a1 used in an interposer module 220, according to one or more embodiments. The first metal RDL via 241a2 may contact one of the metal interconnect layers 230a in the inorganic dielectric layers 230. The first metal RDL via 241a2 may be formed in the first organic dielectric layer 241 and the second metal RDL line 242a1 may be formed on a surface of the first organic dielectric layer 241. The second metal RDL line 242a1 may be formed together with the first metal RDL via 241a2 in an SAP process.

FIG. 6B is a vertical cross-sectional view of an intermediate structure including the second organic dielectric layer 242, according to one or more embodiments. The second organic dielectric layer 242 may be formed on a surface of the first organic dielectric layer 241 and over the second metal RDL line 242a1. The second organic dielectric layer 242 may be composed of a dielectric polymer material such as polyimide (PI), benzocyclobutene (BCB), or polybenzo-bisoxazole (PBO). Other suitable materials are within the contemplated scope of disclosure. The second organic dielectric layer 242 may be formed for example, by chemical vapor deposition (CVD), physical vapor deposition (PVD), spin coating, lamination or other suitable deposition technique.

An opening $242_O$ may be formed in the second organic dielectric layer 242. The opening $242_O$ may be formed in the second organic dielectric layer 242 so as to be substantially aligned in the z-direction with the first metal RDL via 241a2. The opening $242_O$ may be formed, for example, by using a photolithographic process. The photolithographic process may include forming a patterned photoresist layer (not shown) on the second organic dielectric layer 242, and etching (e.g., wet etching, dry etching, etc.) the exposed upper surface of the second organic dielectric layer 242 through openings in the photoresist layer. The photoresist layer may be subsequently removed by ashing, dissolving the photoresist layer or by consuming the photoresist layer during the etch process.

FIG. 6C is a vertical cross-sectional view of an intermediate structure including a seed layer 601, according to one or more embodiments. The seed layer 601 (e.g., an ultra-thin conductive seed layer) may include, for example, an electroless copper plating. The seed layer 601 may be formed in the opening $242_O$ and on a surface of the second organic dielectric layer 242.

FIG. 6D is a vertical cross-sectional view of an intermediate structure including a photoresist layer 602, according to one or more embodiments. As illustrated in FIG. 6D, the photoresist layer may be formed on the seed layer 601. An opening $602_O$ may be formed in the photoresist layer 602 by photolithography so as to expose the seed layer 601 in the opening $242_O$ and on part of the surface of the second organic dielectric layer 242.

Figure 6E:
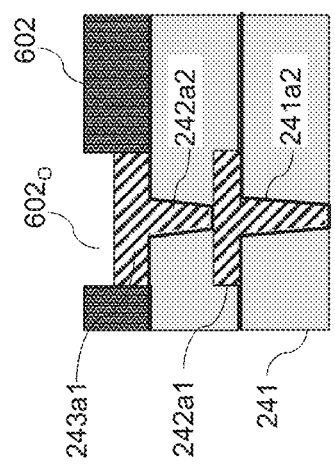
FIG. 6E is a vertical cross-sectional view of an intermediate structure including a second metal RDL via and a third metal RDL line, according to one or more embodiments

FIG. 6E is a vertical cross-sectional view of an intermediate structure including a second metal RDL via 242a2 and a third metal RDL line 243a1, according to one or more embodiments. The second metal RDL via 242a2 and a third metal RDL line 243a1 may be form by performing an electrolytic copper plating process. In the electrolytic copper plating process, the second metal RDL via 242a2 may be plated on the seed layer 601 in the opening $242_O$, and the third metal RDL line 243a1 may be plated on the seed layer 601 in the opening $602_O$ in the photoresist layer 602.

Figure 6F:
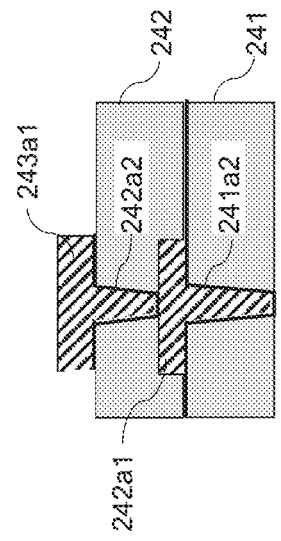
FIG. 6F is a vertical cross-sectional view of an intermediate structure in which the photoresist layer has been removed, according to one or more embodiments.

FIG. 6F is a vertical cross-sectional view of an intermediate structure in which the photoresist layer 602 has been removed, according to one or more embodiments. The photoresist layer 602 may be removed by ashing or dissolving the photoresist layer. In addition, the seed layer 601 that was covered by the photoresist layer 602 on the surface of the second organic dielectric layer 242 may be removed by etching (e.g., wet etching or dry etching).

Figure 7:
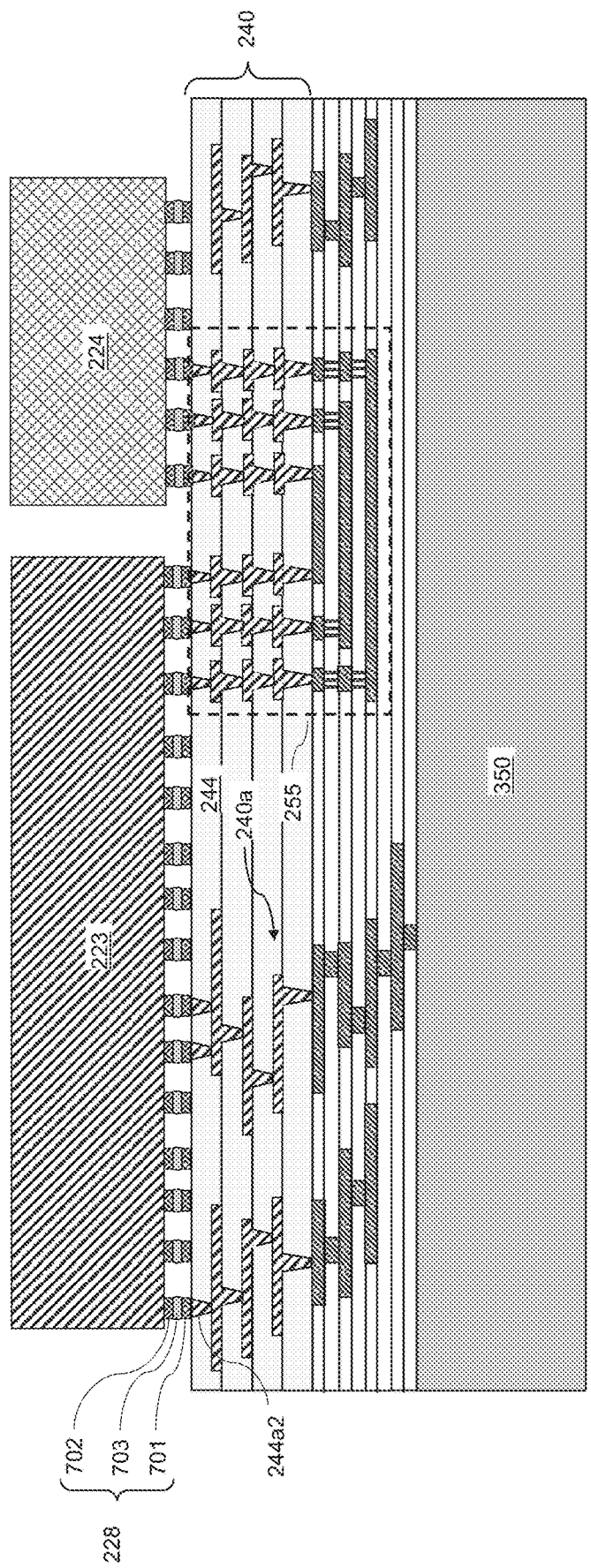
FIG. 7 is a vertical cross-sectional view of an intermediate structure including the first semiconductor die and the second semiconductor die, according to one or more embodiments.

FIG. 7 is a vertical cross-sectional view of an intermediate structure of an interposer module 220 including the first semiconductor die 223 and the second semiconductor die 224, according to one or more embodiments. The first semiconductor die 223 and second semiconductor die 224 may be mounted (e.g., in a pick and place (PNP) process) on an upper surface of the organic dielectric layers 240. The first semiconductor die 223 and second semiconductor die 224 may be electrically connected to the metal RDL layers 240a in the organic dielectric layers 240.

One or more metallic bump structures 701 may be formed on an upper surface of the fourth organic dielectric layer 244. The metallic bump structures 701 may include, for example, contact pads on or in the upper surface of the fourth organic dielectric layer 244. In particular, the metallic bump structures 701 may contact a fourth metal RDL via 244a2 that is formed in the fourth organic dielectric layer 244. In addition, one or more metallic bump structures 702 may be formed on a bottom surface of the first semiconductor die 223 and second semiconductor die 224. The first semiconductor die 223 and second semiconductor die 224 may be mounted on the organic dielectric layer 240 by forming a soldering material portion 703 between the metallic bump structures 701 to the metallic bump structures 702. In particular, each semiconductor die (223, 224) may be mounted by a C2 bonding process that includes solder bonding between a pair of the metallic bump structures 701, 702. The C2 bonding process may reflow the solder material portions 703 after the die bump structures 702 of the semiconductor dies (223, 224) are disposed over the array of solder material portions 703.

A metallic bump structure 701, metallic bump structure 702 and soldering material portion 703 together may constitute a micro-bump structure 228. The under bump metallization (UBM) of the micro-bump structure 228 may include, for example, Cu/Ni/Cu/Sn: 8/5/4/7, stand of height (SOH): 45 µm). Each semiconductor die (223, 224) may be connected to the organic dielectric layers 240 by a plurality of the micro-bump structures 228. In one or more embodiments, the micro-bump structures 228 may include a two-dimensional array of micro-bump structures 228.

The semiconductor dies (223, 224) may include any type of semiconductor die. In particular, the semiconductor dies (223, 224) may include a system-on-chip (SoC) die such as an application processor die, a high bandwidth memory (HDM) die or a system on integrated chips (SOIC) die. The semiconductor dies (223, 224) may be different from each other. In one embodiment, one or more of the first semiconductor die 223 and second semiconductor die 224 may include a central processing unit die, a graphic processing unit die, a system-on-chip (SoC) die, and high bandwidth memory (HBM) die, each of which includes a vertical stack of static random access memory dies and provides high bandwidth under JEDEC standards, i.e., standards defined by The JEDEC Solid State Technology Association.

As illustrated in FIG. 7, a plurality of the micro-bump structures 228 may connect the first semiconductor die 223 and the second semiconductor die 224 to the die-to-die bridge 255 that is formed in the interposer 250. In particular, one of the micro-bump structures 228 may be connected to each of the metal RDL via stacks 240b1-240b6 in the die-to-die-bridge 255. This connection may facilitate communication (e.g., I/O communication) between the first semiconductor die 223 and second semiconductor die 224 through the die-to-die bridge 255.

Figure 8:
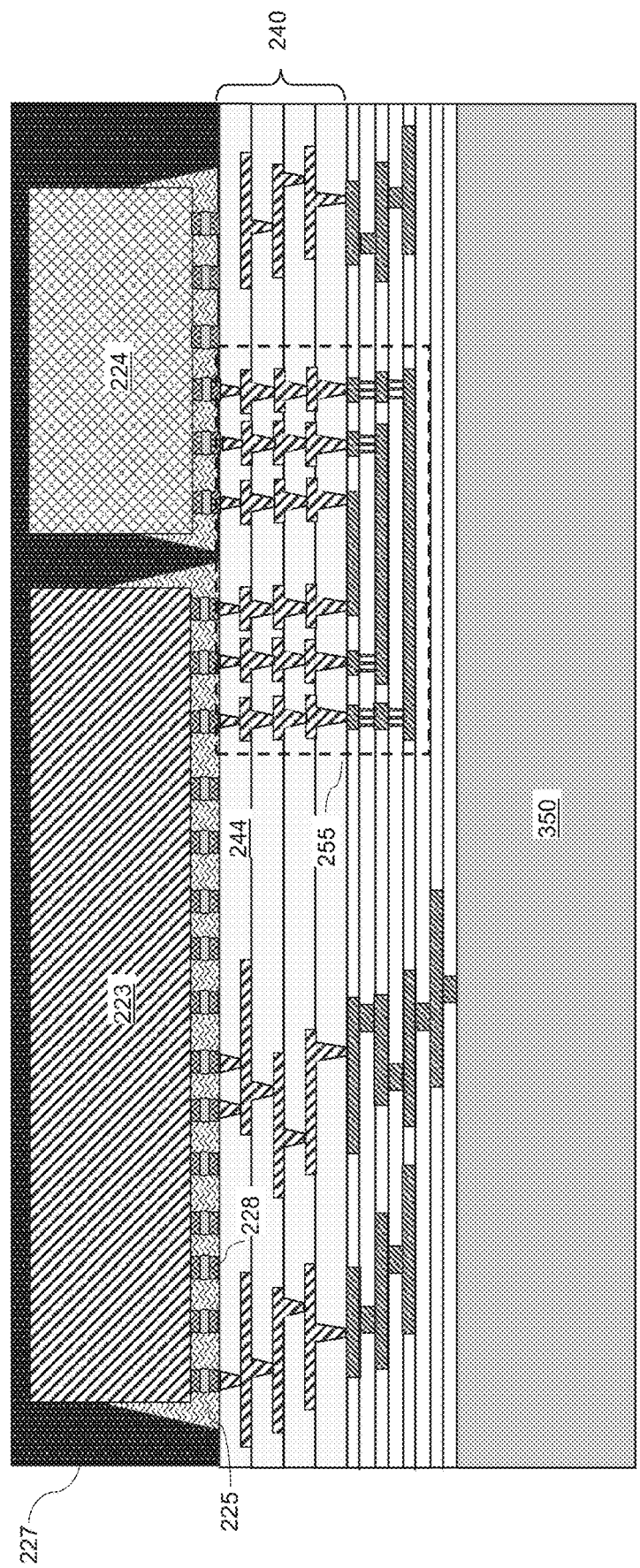
FIG. 8 is a vertical cross-sectional view of an intermediate structure including the interposer underfill layer and molding material layer, according to one or more embodiments.

FIG. 8 is a vertical cross-sectional view of an intermediate structure of an interposer module 220 including the interposer underfill layer 225 and molding material layer 227, according to one or more embodiments. The interposer underfill layer 225 may be formed by injecting an underfill material around the array of micro-bump structures 228 after the solder material portions 703 are reflowed. Any known underfill material application method may be used, which may be, for example, the capillary underfill method, the molded underfill method, or the printed underfill method.

The interposer underfill layer 225 may be formed continuously underneath the semiconductor dies (223, 224). The interposer underfill layer 225 may be formed separately underneath each the semiconductor dies (223, 224).

A molding material layer 227 (e.g., epoxy molding compound (EMC)) may be formed on the interposer 250 and the semiconductor dies (223, 224) so as to form an EMC die frame. In particular, the molding material layer 227 may be formed by a molding process/molding compound grinding process MD/MCG (e.g., mold: 297; from 90 μm to 40 μm). The molding material layer 227 may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flow ability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

The molding material layer 227 (e.g., EMC) may be cured at a curing temperature to form an EMC die frame that may laterally enclose the semiconductor dies (223, 224). Excess portions of the molding material layer 227 may be removed from above the horizontal plane including the top surfaces of the semiconductor dies (223, 224) by a planarization process, which may use chemical mechanical planarization (CMP).

Figure 9:
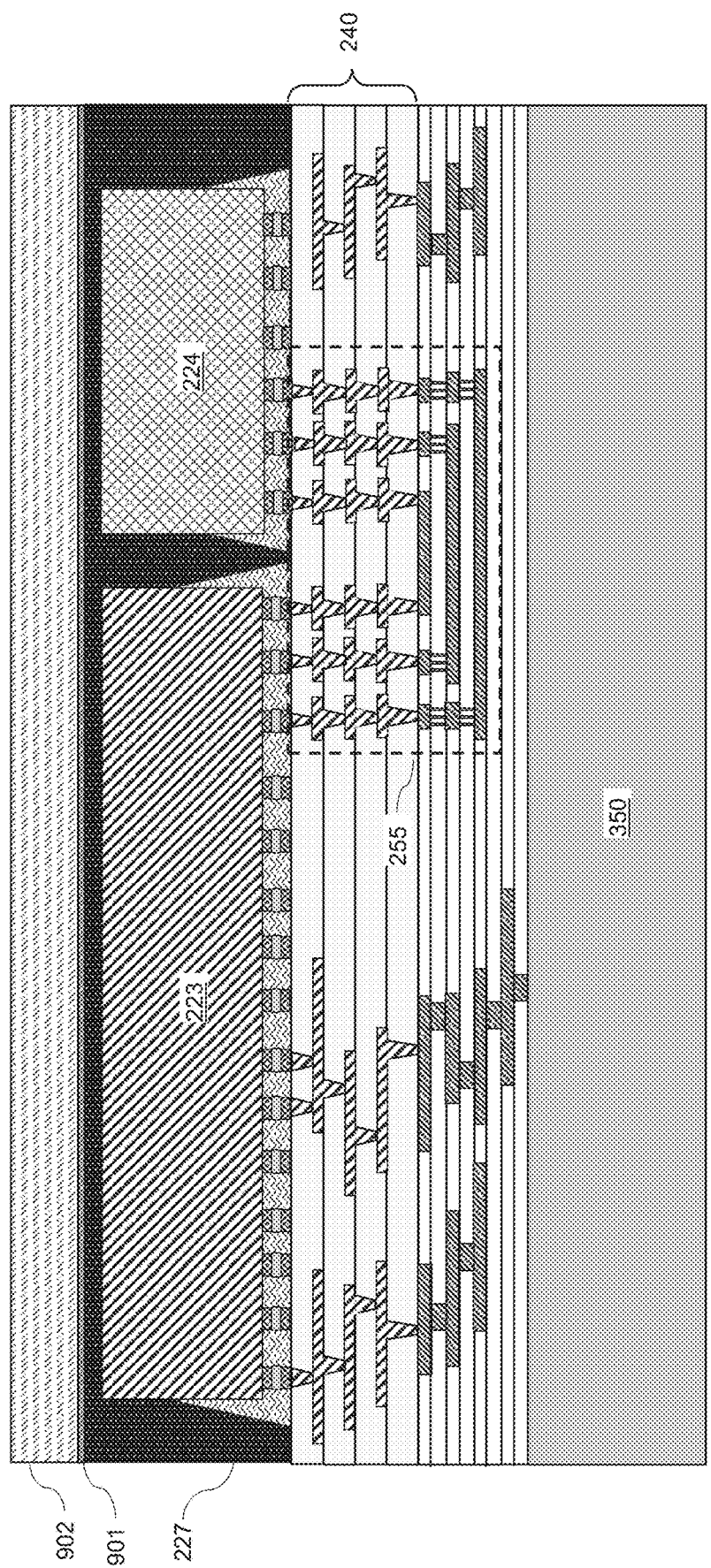
FIG. 9 is a vertical cross-sectional view of an intermediate structure including a glass carrier structure, according to one or more embodiments.

FIG. 9 is a vertical cross-sectional view of an intermediate structure of an interposer module 220 including a glass carrier structure 902, according to one or more embodiments. An adhesive layer 901 may be applied to an upper surface of the molding material layer 227. In this embodiment, the adhesive layer 901 may include a light-to-heat conversion (LTHC) layer. The LTHC layer is a solvent-based coating applied using a spin coating method. The LTHC layer may form a layer that converts ultraviolet light to heat such that the LTHC layer loses adhesion. For example, the LTHC layer may include Light-To-Heat Conversion Release Coating (LTHC) ink™ that is commercially available from the 3M Company™. Alternatively, the adhesive layer 901 may include a thermally decomposing adhesive material. For example, the adhesive layer 901 may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

The glass carrier structure 902 may be bonded to the adhesive layer 901. The glass carrier structure 902 may include a layer of glass material having a thickness in a range of 600 μm to 1000 μm. The glass carrier structure 902 may include a rigid structure that supports the intermediate structure in subsequent processing.

Figure 10:
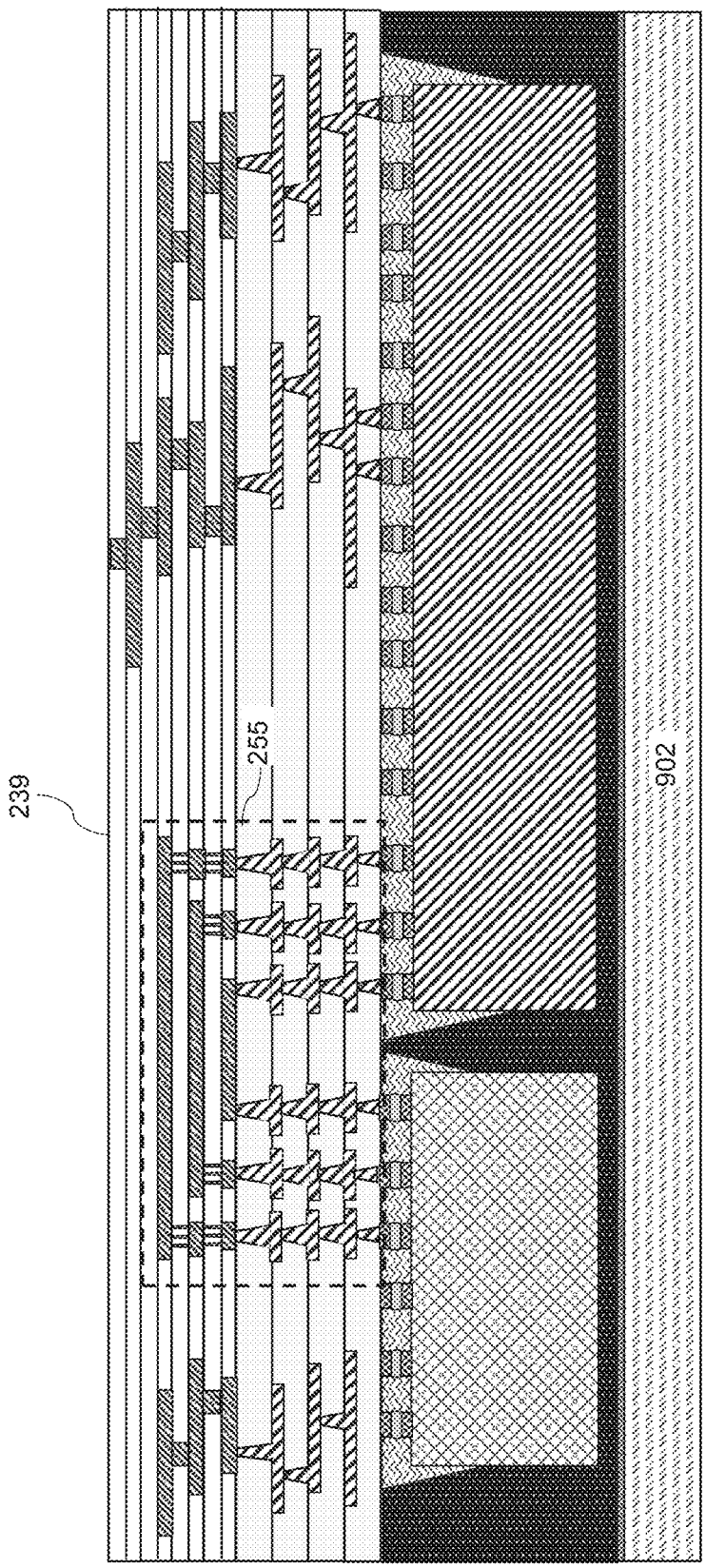
FIG. 10 is a vertical cross-sectional view of an intermediate structure in which the silicon substrate has been removed, according to one or more embodiments.

FIG. 10 is a vertical cross-sectional view of an intermediate structure of an interposer module 220 in which the silicon substrate 350 has been removed, according to one or more embodiments. In removing the silicon substrate 350, the intermediate structure of the interposer module 220 may be inverted so as to rest on the glass carrier structure 902. The silicon substrate 350 may be removed by an etching process that may include, for example, wet etching, dry etching, etc. The silicon substrate 350 may be removed so as to expose a bottom surface 239 of the inorganic dielectric layers 230.

Figure 11:
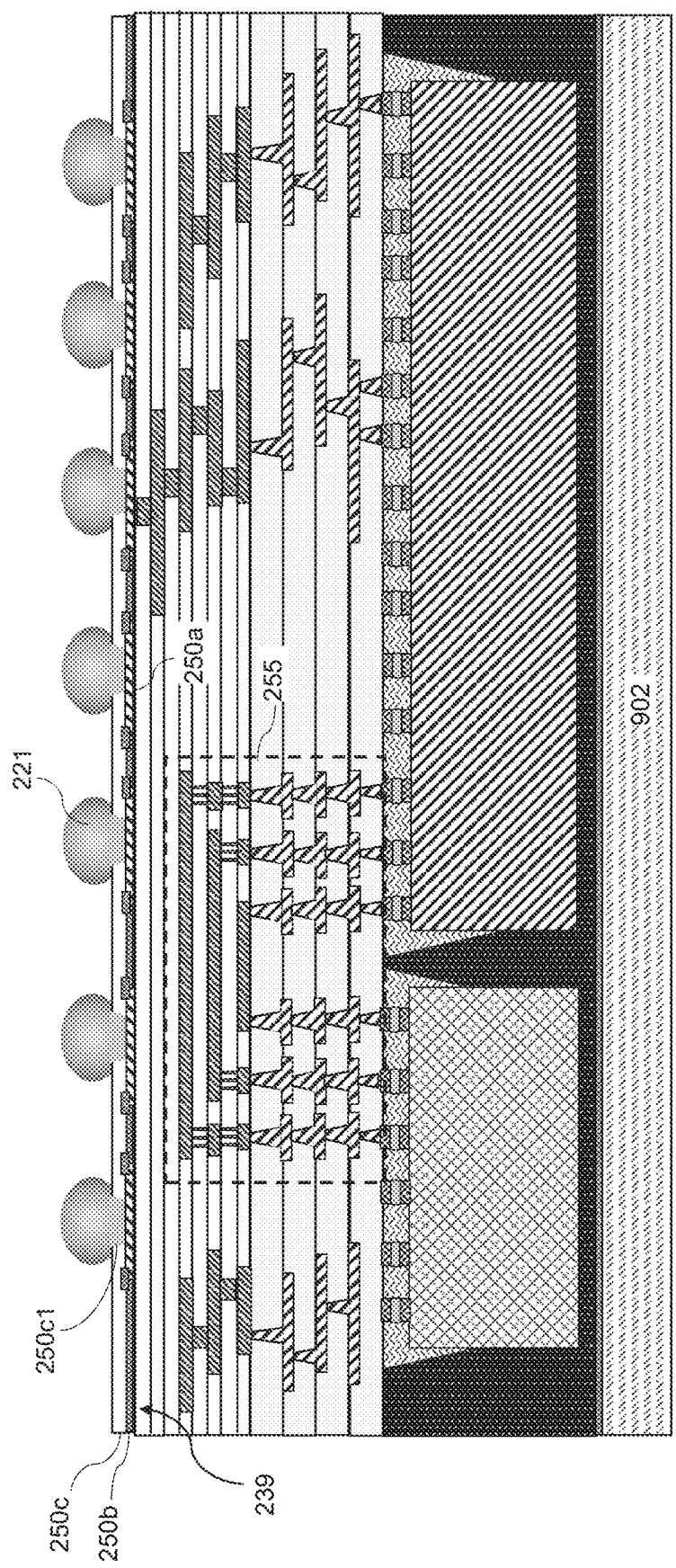
FIG. 11 is a vertical cross-sectional view of an intermediate structure including the plurality of C4 bumps, according to one or more embodiments.

FIG. 11 is a vertical cross-sectional view of an intermediate structure of an interposer module 220 including the plurality of C4 bumps 221, according to one or more embodiments. The plurality of metal bonding pads 250a may be formed on the bottom surface 239 of the inorganic dielectric layers 230 (e.g., a package substrate side of the interposer 250). To form the metal bonding pads 250a, a layer of metal material (e.g., copper, aluminum or other suitable conductive materials) may be deposited (e.g., by CVD, PVD or other suitable deposition technique) on the bottom surface 239 of the inorganic dielectric layers 230. The metal layer may be etched (e.g., by wet etching, dry etching, etc.) so as to form the metal bonding pads 250a. The metal bonding pads 250a may be formed in contact with the metal interconnect layers 230a.

The passivation layer 250b may be deposited (e.g., by CVD, PVD or other suitable deposition technique) on the bottom surface 239 of the inorganic dielectric layers 230 and on the metal bonding pads 250a. The passivation layer 250b may be etched by a photolithographic process to expose a surface of the metal bonding pads 250a. As illustrated in FIG. 11, the passivation layer 250b may remain around an outer edge of the metal bonding pads 250a. The passivation layer 250b may include, for example, silicon oxide, silicon nitride, low-k dielectric materials such as carbon-doped oxides, extremely low-k dielectric materials such as porous carbon doped silicon dioxide, a combination thereof or other suitable material.

The protection layer 250c may be deposited (e.g., by CVD, PVD or other suitable deposition technique) on the passivation layer 250b and the metal bonding pads 250a. The protection layer 250c may include, for example, poly-benzoxazole (PBO), polyimide, benzocyclobutene (BCB), or other suitable dielectric material. The protection layer 250c may be etched (e.g., by wet etching, dry etching, etc.) to form recessed portions 250c1 in the protection layer 250c and expose a surface of the metal bonding pads 250a.

The C4 bumps 221 may be formed on the plurality of metal bonding pads 250a through the recessed portions 250c1 of the protection layer 250c. The C4 bumps 221 may include a two-dimensional array of C4 solder balls (UBM Cu/Sn: 40/30).

Figure 12:
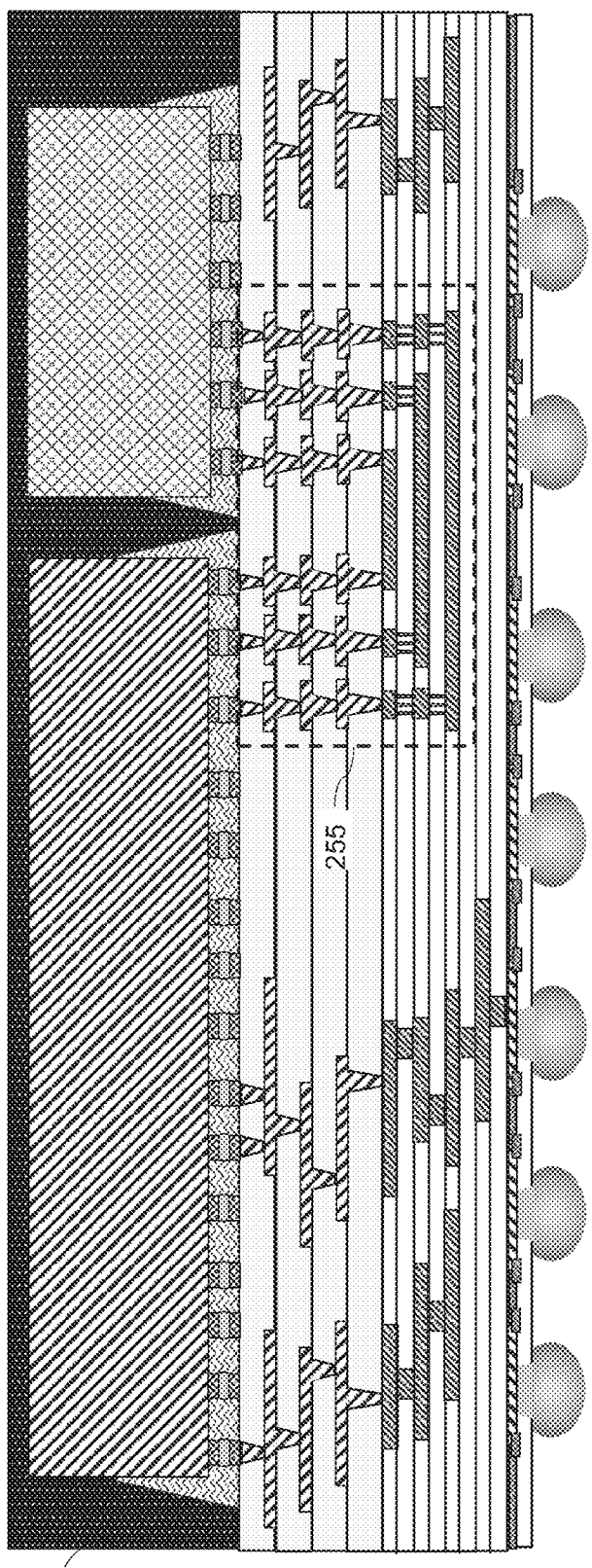
FIG. 12 is a vertical cross-sectional view of an intermediate structure in which the glass carrier structure has been removed, according to one or more embodiments.

FIG. 12 is a vertical cross-sectional view of an intermediate structure of an interposer module 220 in which the glass carrier structure 902 has been removed, according to one or more embodiments. The glass carrier structure 902 may be removed by applying heat or light to the intermediate structure so as to decompose the adhesive layer 901. Removing the glass carrier structure 902 may expose an upper surface of the molding material layer 227.

Figure 13:
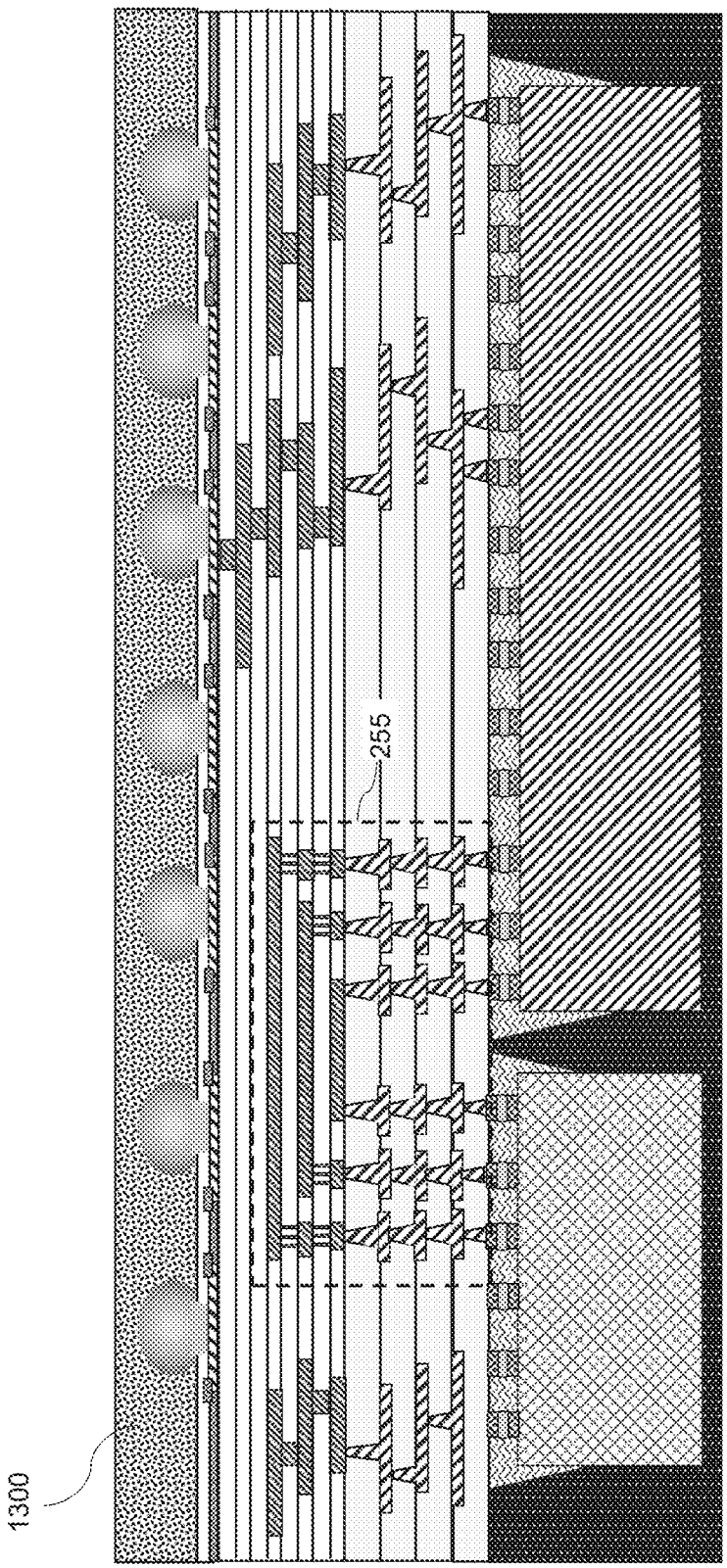
FIG. 13 is a vertical cross-sectional view of an intermediate structure including a ball grid (BG) tape lamination, according to one or more embodiments.

FIG. 13 is a vertical cross-sectional view of an intermediate structure of an interposer module 220 including a ball grid (BG) tape lamination 1300, according to one or more embodiments. In order to protect the C4 bumps 221 in subsequent processes, a BG tape lamination 1300 may be applied over and around the C4 bumps 221 (e.g., two-dimensional array of C4 solder balls). The BG tape lamination 1300 may include an adhesive material such at that in the adhesive layer 901.

Figure 14:
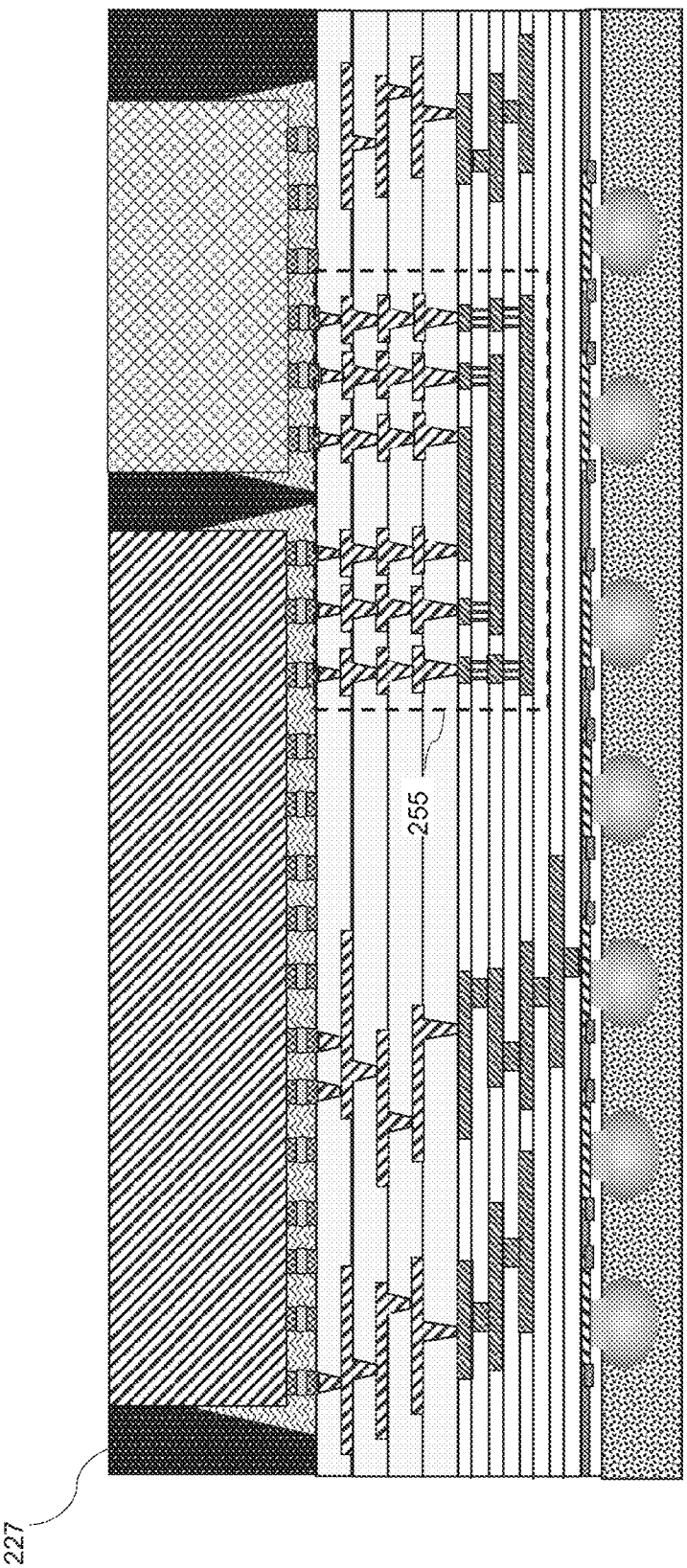
FIG. 14 is a vertical cross-sectional view of an intermediate structure in which the molding material layer has been planarized, according to one or more embodiments.

FIG. 14 is a vertical cross-sectional view of an intermediate structure of an interposer module 220 in which the molding material layer 227 has been planarized, according to one or more embodiments. The molding material layer 227 may be planarized, for example, by CMP. The planarization process may be performed until the molding material layer 227 has been removed from an upper surface of the first semiconductor die 223 and the second semiconductor die 224. The planarization process may result in an upper surface of the molding material layer 227 being substantially co-planar with the upper surface of the first semiconductor die 223 and the second semiconductor die 224.

Figure 15:
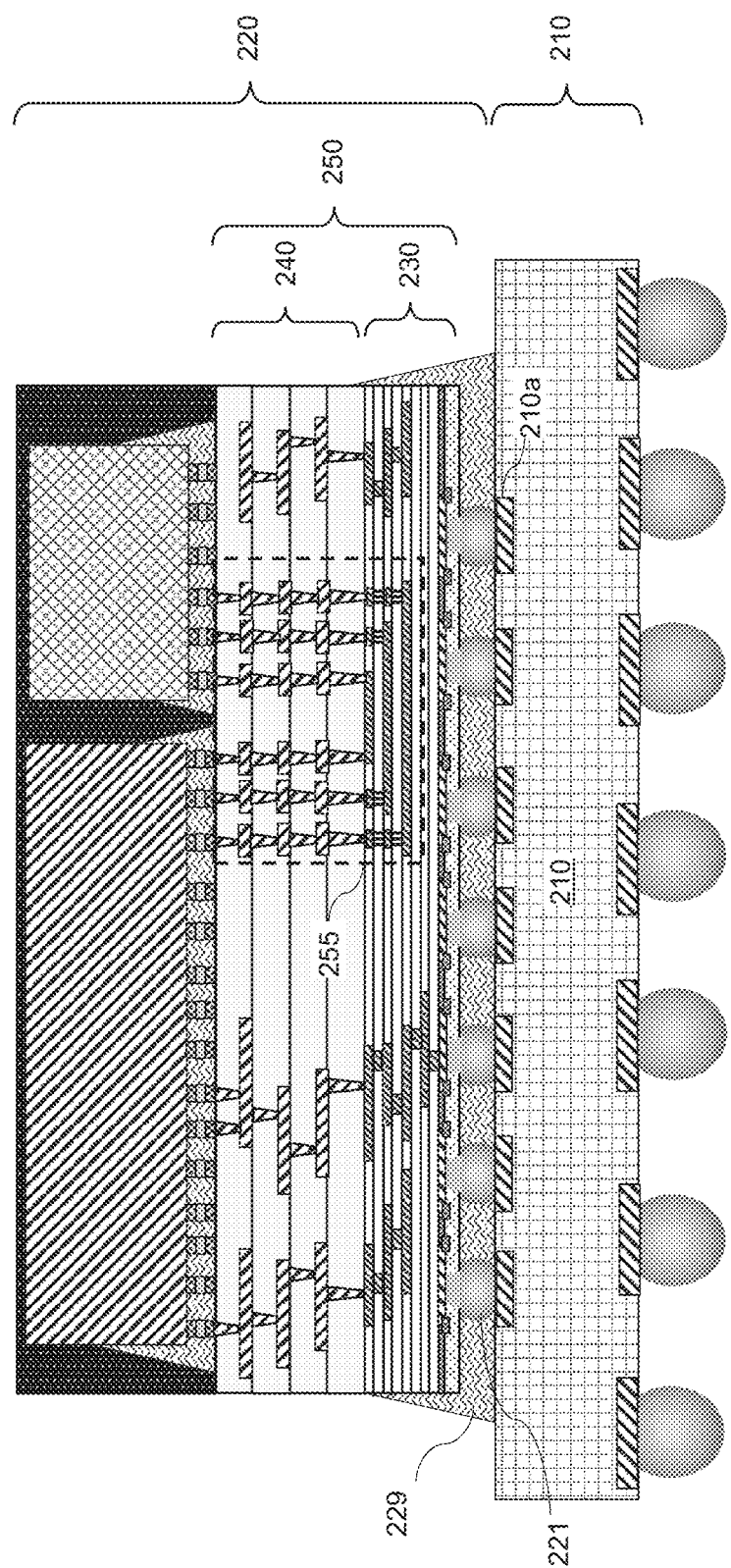
FIG. 15 is a vertical cross-sectional view of the semiconductor package including an interposer module mounted on a package substrate, according to one or more embodiments.

FIG. 15 is a vertical cross-sectional view of a semiconductor package including the interposer module 220 mounted on a package substrate 210, according to one or more embodiments.

After performing the CMP process to planarize the upper surface of the molding material layer 227 and the upper surface of the first semiconductor die 223 and the second semiconductor die 224, the intermediate structure may be placed on a frame mount. A dicing or sawing operation may be performed in order to separate the intermediate structure from other devices. The BG tape lamination 1300 may be removed. The frame mount may be removed at which point the manufacturing of the interposer module 220 may be completed.

The interposer module 220 may be mounted on the package substrate 210. The interposer module 220 may be mounted on the substrate 210 by bonding the C4 bumps 221 to the metal bonding pads 210*a* in the package substrate 210. A package underfill layer 229 may be formed on the package substrate 210 and under and around the interposer module 220 and the C4 bumps 221 so as to adhere the interposer module 220 to the package substrate 210. The package underfill layer 229 may be formed by injecting an underfill material around the array of C4 bumps 221 after the solder material of the C4 bumps 221 is reflowed. Any known underfill material application method may be used, which may be, for example, the capillary underfill method, the molded underfill method, or the printed underfill method. The package underfill layer 229 may be formed of an epoxy-based polymeric material.

Figure 16:
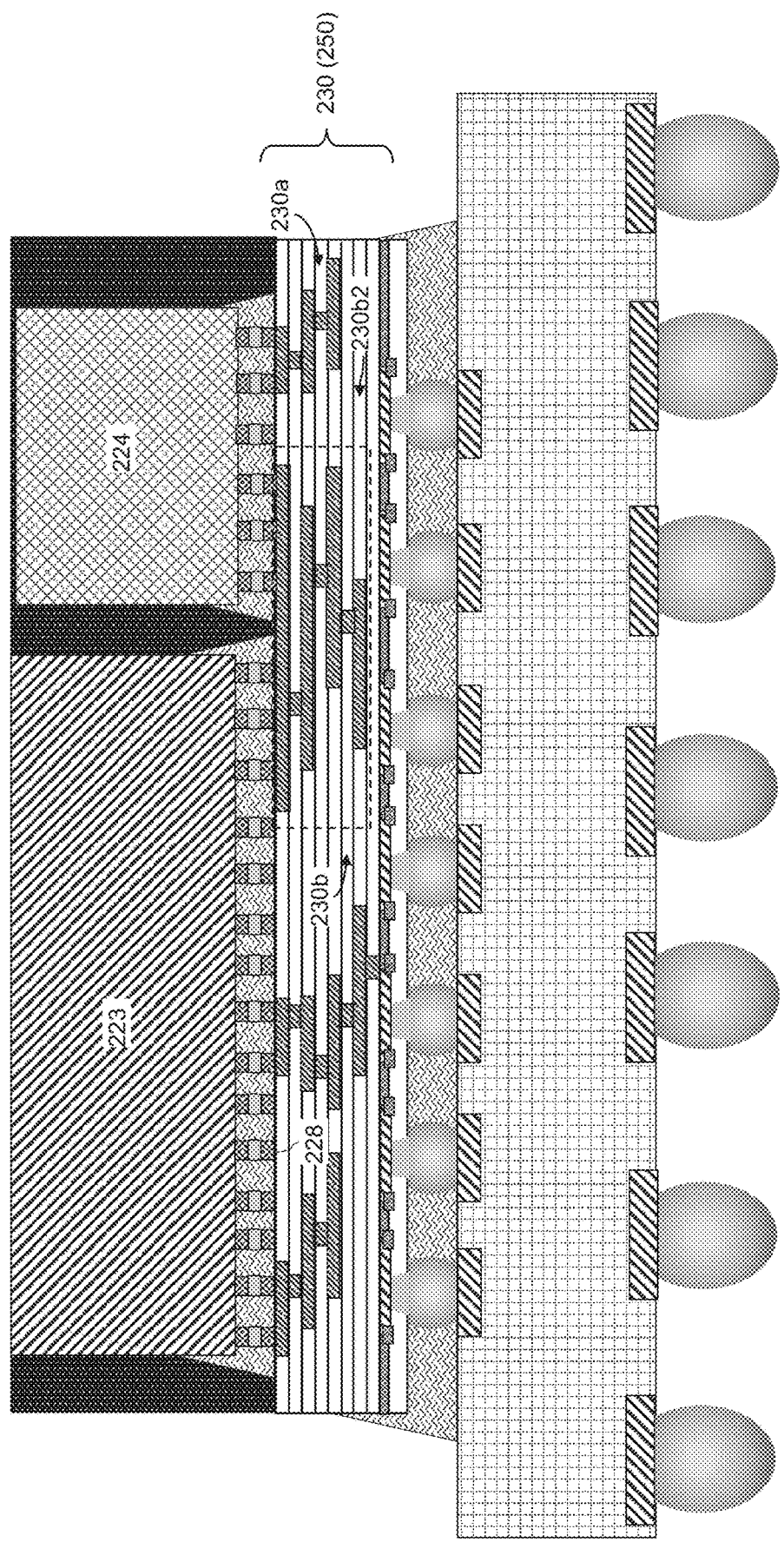
FIG. 16 is a vertical cross-sectional view of an alternative design of the semiconductor package, according to one or more embodiments.

FIG. 16 is a vertical cross-sectional view of an alternative design of the semiconductor package including the interposer module 220, according to one or more embodiments. As illustrated in FIG. 16, in this alternative design, the interposer 250 may include the inorganic dielectric layers 230, but not the organic dielectric layers 240. That is, the interposer 250 may be composed of only the inorganic dielectric layers 230.

In this alternative design, the metal interconnect layers 230*a* (e.g., copper interconnect layers) in the inorganic dielectric layers 230 may be connected (e.g., directly connected) to the micro-bump structures 228. The metal interconnect layers 230*a* may include, for example, one or more metal interconnect layer sets 230*b* that may be connected to both the first semiconductor die 223 and the second semiconductor die 223. Thus, the metal interconnect layers 230*a* in this alternative design may facilitate communication (e.g., I/O communication) between the first semiconductor die 223 and the second semiconductor die 224.

Figure 17:
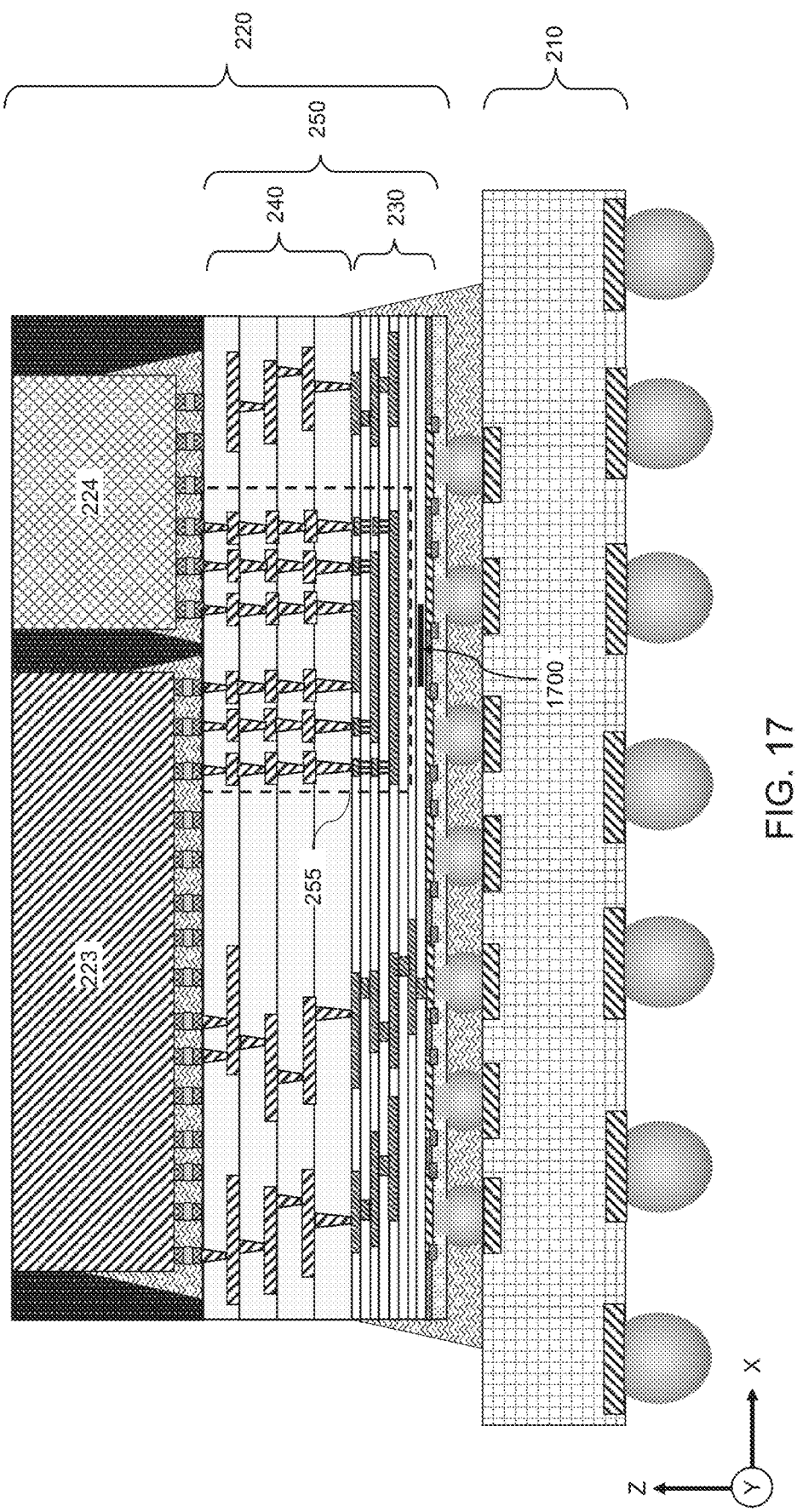
FIG. 17 is a vertical cross-sectional view of a second alternative design of the semiconductor package, according to one or more embodiments.

FIG. 17 is a vertical cross-sectional view of a second alternative design of the semiconductor package including the interposer module 220, according to one or more embodiments. As illustrated in FIG. 17, in this second alternative design, a super high density metal-insulator-metal (SHDMiM) capacitor 1700 may be formed in the inorganic dielectric layers 230. In particular, the SHDMiM capacitor 1700 may be formed in one or more passivation layers of the inorganic dielectric layers 230. As illustrated in FIG. 17, the SHDMiM capacitor 1700 may be formed in the inorganic dielectric layers 230 (e.g., a passivation layer in the inorganic dielectric layers 230) below the die-to-die bridge 255. In one or more embodiments, center of the SHDMiM capacitor 1700 may be substantially aligned in the z-direction with a center of each of the metal interconnect lines (e.g., first metal interconnect line 231*a*1, second metal interconnect line 232*a*1 and third metal interconnect line 233*a*1) in the die-to-die bridge 255. In one or more embodiments, the SHDMiM capacitor 1700 may include or be replaced by a planar type capacitor, a cylinder type capacitor, a bar type capacitor, a trench capacitor, a dual-damascene type capacitor, an inductor and/or a resistor.

The SHDMiM capacitor 1700 may be inserted between metal interconnect lines of the metal interconnect layers 230*a*. The SHDMiM capacitor 1700 can effectively be used for system-level decoupling applications.

Figure 18:
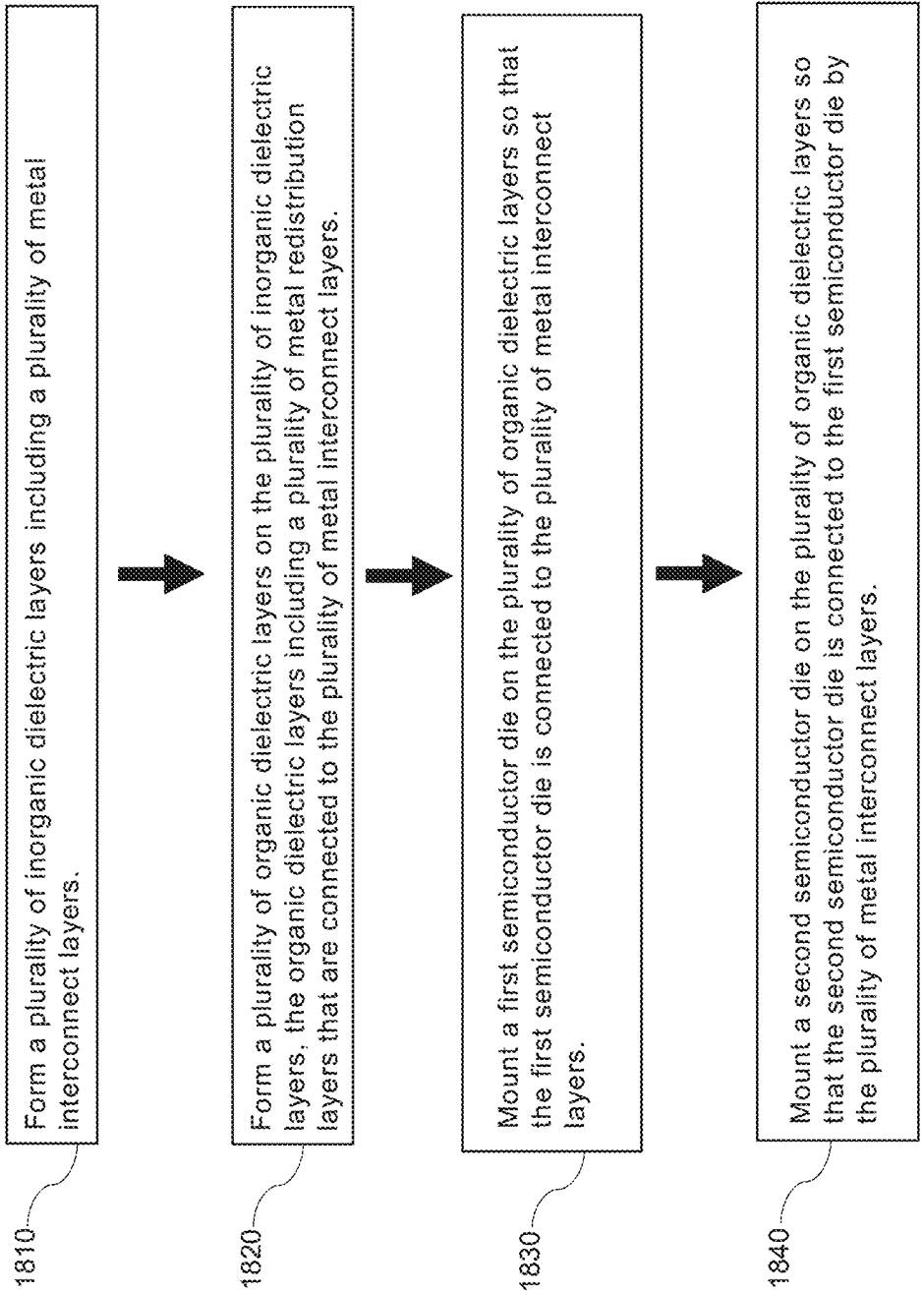
FIG. 18 is a flow chart illustrating operations in a method of making a semiconductor package, according to one or more embodiments.

FIG. 18 illustrates a method of making a semiconductor package including the interposer module 220, according to one or more embodiments. The method includes a Step 1810 of forming a plurality of inorganic dielectric layers 230 including a plurality of metal interconnect layers 230*a*, a Step 1820 of forming a plurality of organic dielectric layers 240 on the plurality of inorganic dielectric layers 230, the plurality of organic dielectric layers 240 including a plurality of redistribution layers 240*a* connected to the plurality of metal interconnect layers 230*a*, a Step 1830 of mounting a first semiconductor die 223 on the plurality of organic dielectric layers so that the first semiconductor die is connected to the plurality of metal interconnect layers, and a Step 1840 of mounting a second semiconductor die on the plurality of organic dielectric layers so that the second semiconductor die is connected to the first semiconductor die by the plurality of metal interconnect layers. The method illustrated in FIG. 18 may be used to form, for example, the embodiment structures illustrated in FIGS. 15 and 17, discussed above.

Figure 19:
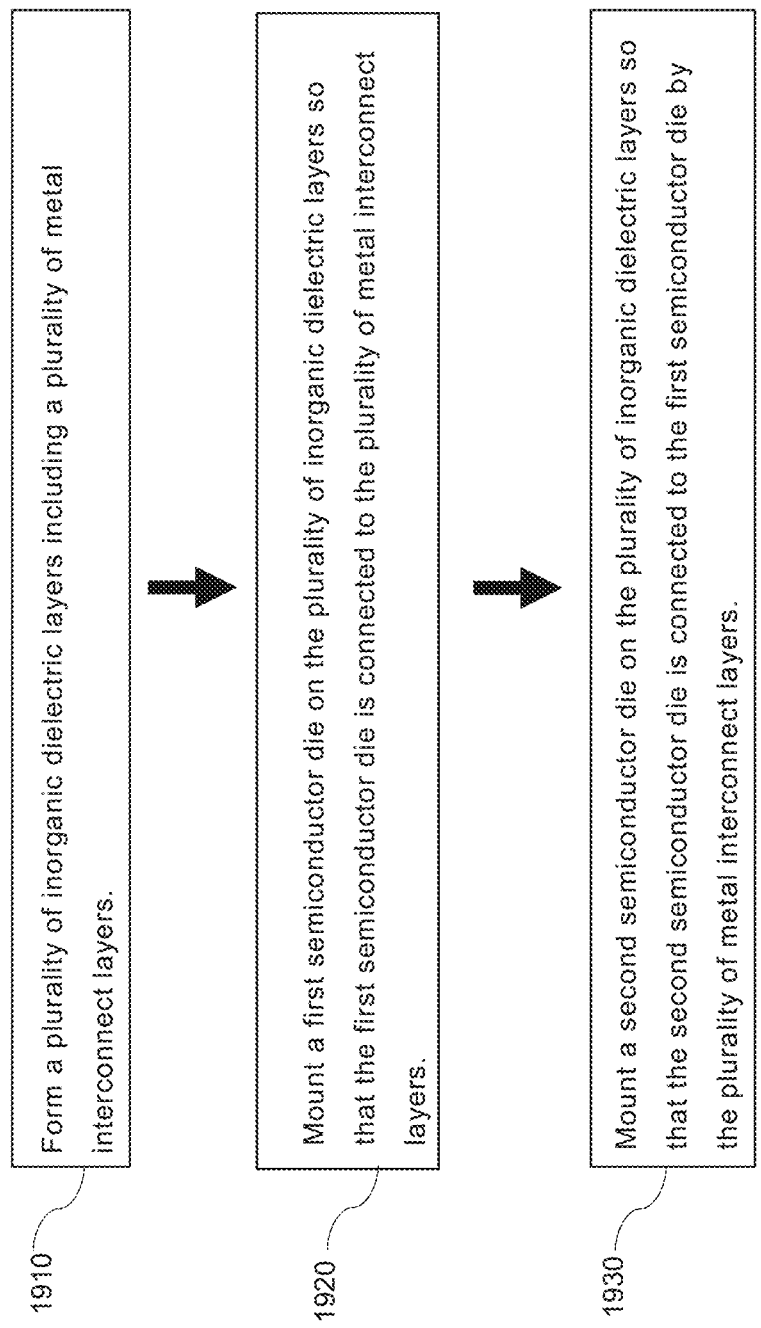
FIG. 19 is a flow chart illustrating operations in another method of making a semiconductor package, according to one or more embodiments.

FIG. 19 illustrates an alternative method of making a semiconductor package including the interposer module 220 (e.g., the alternative design of FIG. 16), according to one or more embodiments. The method includes a Step 1910 of forming a plurality of inorganic dielectric layers 230 including a plurality of metal interconnect layers 230*a*, a Step 1920 of mounting a first semiconductor die 223 on the plurality of inorganic dielectric layers so that the first semiconductor die is connected to the plurality of metal interconnect layers, and a Step 1930 of mounting a second semiconductor die on the plurality of inorganic dielectric layers so that the second semiconductor die is connected to the first semiconductor die by the plurality of metal interconnect layers. The method illustrated in FIG. 19 may be used to form, for example, the embodiment structures illustrated in FIG. 16, discussed above.

Referring to FIGS. 1-15 and 17-18, a semiconductor package may be provided, wherein the semiconductor package may include a plurality of inorganic dielectric layers 230 that may include a plurality of metal interconnect layers 230*a* formed therein and a plurality of first contact pads 233*c*, a plurality of organic dielectric layers 240 disposed on and electrically connected to the plurality of inorganic dielectric layers 230. The plurality of organic dielectric layers 240 may include a plurality of metal redistribution layers 240*a* formed therein, wherein the plurality of metal redistribution layers 240*a* may be physically connected to the plurality of first contact pads, and a semiconductor die mounted on the plurality of organic dielectric layers and electrically connected to the plurality of metal redistribution layers through the plurality of metal interconnect layers.

In one embodiment, the plurality of metal interconnect layers 230a may include a first metal interconnect line 231a1, and the plurality of metal redistribution layers 240a may include a first metal redistribution layer (RDL) via 241a2 connected to the first metal interconnect line 231a1 and/or the contact pads 233c. In one embodiment, the plurality of metal redistribution layers 240a may further include a metal RDL line 242a1 having a thickness that is greater than a thickness of the first metal interconnect line 231a1. In one embodiment, the plurality of metal redistribution layers 240a may include a first metal RDL via stack 240b1 including the first metal RDL via, and a second metal RDL via stack 240b2 including a second metal RDL via connected to the first metal interconnect line 231a1. In one embodiment, the first metal RDL via is connected to a first end of the first metal interconnect line 231a1 and the second metal RDL via is connected to a second end of the first metal interconnect line 231a1 that is opposite the first end. In one embodiment, the plurality of metal interconnect layers 230a may include a plurality of metal interconnect lines, and the plurality of metal redistribution layers 240a may include a plurality of metal redistribution layer (RDL) via stacks, and the plurality of metal RDL via stacks may include a first metal RDL via stack 240b1 connected to a first end of a first metal interconnect line 231a1 in the plurality of metal interconnect lines, and a second metal RDL via stack 240b2 connected to a second end of the first metal interconnect line 231a1 that is opposite the first end.

Referring again to FIGS. 1-19, a semiconductor package may be provided, wherein the semiconductor package may include an interposer 250 including a plurality of inorganic dielectric layers 230 including a plurality of metal interconnect layers 230a having a damascene structure, a first semiconductor die 223 mounted on the interposer 250 and connected to the plurality of metal interconnect layers 230a, and a second semiconductor die 224 mounted on the interposer 250 and coupled to the first semiconductor die 223 by the plurality of metal interconnect layers 230a. In one embodiment, the interposer 250 may further include a plurality of organic dielectric layers 240 on the plurality of inorganic dielectric layers 230, the plurality of organic dielectric layers 240 including a plurality of metal redistribution layers 240a connected to the plurality of metal interconnect layers 230a. In one embodiment, the plurality of metal interconnect layers 230a may include a first metal interconnect line 231a1, and the plurality of metal redistribution layers 240a may include a first metal redistribution layer (RDL) via connected to the first metal interconnect line 231a1. In one embodiment, the plurality of metal redistribution layers 240a may include a first metal RDL via stack 240b1 including the first metal RDL via, and a second metal RDL via stack 240b2 including a second metal RDL via connected to the first metal interconnect line 231a1. In one embodiment, the first metal RDL via is connected to a first end of the first metal interconnect line 231a1 and the second metal RDL via is connected to a second end of the first metal interconnect line 231a1 that is opposite the first end. In one embodiment, the plurality of metal interconnect layers 230a may include a plurality of metal interconnect lines, and the plurality of metal redistribution layers 240a may include a plurality of metal redistribution layer (RDL) via stacks, and the plurality of metal RDL via stacks may include a first metal RDL via stack 240b1 connected to a first end of a first metal interconnect line 231a1 in the plurality of metal interconnect lines, and a second metal RDL via stack 240b2 connected to a second end of the first metal interconnect line 231a1 that is opposite the first end. In one embodiment, the first metal RDL via stack 240b1 is connected to the first semiconductor die and the second metal RDL via stack 240b2 is connected to the second semiconductor die. In one embodiment, the plurality of metal RDL via stacks may further include a third metal RDL via stack 240b3 connected to a first end of a second metal interconnect line in the plurality of metal interconnect lines, and a fourth metal RDL via stack 240b4 connected to a second end of the second metal interconnect line that is opposite the first end of the second metal interconnect line. In one embodiment, the first metal interconnect line 231a1 may have a length that is greater than a length of the second metal interconnect line. In one embodiment, the plurality of inorganic dielectric layers 230 may further include a passivation layer that includes a metal-insulator-metal (MIM) capacitor 1700.

Referring again to FIGS. 1-18, a method of making an interposer module, the method may include forming a plurality of inorganic dielectric layers 230 including a plurality of metal interconnect layers 230a having a damascene structure, mounting a first semiconductor die on the plurality of inorganic dielectric layers 230 so that the first semiconductor die is connected to the plurality of metal interconnect layers 230a, and mounting a second semiconductor die on the plurality of inorganic dielectric layers 230 so that the second semiconductor die is connected to the first semiconductor die by the plurality of metal interconnect layers 230a.

The method may further include forming a plurality of organic dielectric layers 240 on the plurality of inorganic dielectric layers 230, and the operation of mounting the first semiconductor die 223 on the plurality of inorganic dielectric layers 230 may include mounting the first semiconductor die 223 to the plurality of organic dielectric layers 240 that are formed on the plurality of inorganic dielectric layers 230, and the operation of mounting the second semiconductor die 224 on the plurality of inorganic dielectric layers 230 may include mounting the second semiconductor die 224 to the plurality of organic dielectric layers 240 that are formed on the plurality of inorganic dielectric layers 230. In one embodiment, forming of the plurality of inorganic dielectric layers 230 may include forming a first metal interconnect line 231a1, and the forming of the plurality of organic dielectric layers 240 may include comprising a first metal redistribution layer (RDL) via connected to the first metal interconnect line 231a1, and the plurality of metal redistribution layers 240a may include a first metal RDL via stack 240b1 including the first metal RDL via, and a second metal RDL via stack 240b2 including a second metal RDL via connected to the first metal interconnect line 231a1. In one embodiment, forming of the plurality of organic dielectric layers 240 may include forming the first metal RDL via to be connected to a first end of the first metal interconnect line 231a1 and forming the second metal RDL via to be connected to a second end of the first metal interconnect line 231a1 that is opposite the first end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a plurality of inorganic dielectric layers including a plurality of metal interconnect layers formed therein and a plurality of first contact pads, wherein the plurality of inorganic dielectric layers comprises a first inorganic dielectric layer, a second inorganic dielectric layer on the first inorganic dielectric layer and a third inorganic dielectric layer on the second inorganic dielectric layer, the plurality of metal interconnect layers comprises a first metal interconnect layer in the first inorganic dielectric layer, a second metal interconnect layer in the second inorganic dielectric layer, and a third metal interconnect layer in the third inorganic dielectric layer, and the second metal interconnect layer is electrically coupled to a pair of first contact pads of the plurality of first contact pads on opposing sides of the third metal interconnect layer in the third inorganic dielectric layer;
a plurality of organic dielectric layers disposed on and electrically connected to the plurality of inorganic dielectric layers and including a plurality of metal redistribution layers formed therein, wherein the plurality of metal redistribution layers are physically connected to the plurality of first contact pads; and
a semiconductor die mounted on the plurality of organic dielectric layers and electrically connected to the plurality of metal redistribution layers through the plurality of metal interconnect layers.

2. The semiconductor package of claim 1, wherein the plurality of metal redistribution layers comprises a first metal redistribution layer (RDL) via connected to the first metal interconnect line.

3. The semiconductor package of claim 2, wherein the plurality of metal redistribution layers further comprises a metal RDL line having a thickness that is greater than a thickness of the first metal interconnect line.

4. The semiconductor package of claim 2, wherein the plurality of metal redistribution layers comprises:
a first metal RDL via stack including the first metal RDL via; and
a second metal RDL via stack including a second metal RDL via connected to the first metal interconnect line.

5. The semiconductor package of claim 4, wherein the first metal RDL via is connected to a first end of the first metal interconnect line and the second metal RDL via is connected to a second end of the first metal interconnect line that is opposite the first end.

6. The semiconductor package of claim 1, wherein the plurality of metal redistribution layers comprises a plurality of metal redistribution layer (RDL) via stacks, and
wherein the plurality of metal RDL via stacks comprises:
a first metal RDL via stack connected to a first end of the first metal interconnect line in the plurality of metal interconnect lines; and
a second metal RDL via stack connected to a second end of the first metal interconnect line that is opposite the first end.

7. A semiconductor package, comprising:
an interposer comprising a plurality of inorganic dielectric layers including a plurality of metal interconnect layers and a plurality of first contact pads comprising a damascene structure, wherein the plurality of inorganic dielectric layers comprises a first inorganic dielectric layer, a second inorganic dielectric layer on the first inorganic dielectric layer and a third inorganic dielectric layer on the second inorganic dielectric layer, the plurality of metal interconnect layers comprises a first metal interconnect layer in the first inorganic dielectric layer, a second metal interconnect layer in the second inorganic dielectric layer, and a third metal interconnect layer in the third inorganic dielectric layer, and the second metal interconnect layer is electrically coupled to a pair of first contact pads of the plurality of first contact pads on opposing sides of the third metal interconnect layer in the third inorganic dielectric layer;
a first semiconductor die mounted on the interposer and connected to the plurality of metal interconnect layers; and
a second semiconductor die mounted on the interposer and coupled to the first semiconductor die by the plurality of metal interconnect layers.

8. The semiconductor package of claim 7, wherein the interposer further comprises a plurality of organic dielectric layers on the plurality of inorganic dielectric layers, the plurality of organic dielectric layers including a plurality of metal redistribution layers connected to the plurality of metal interconnect layers.

9. The semiconductor package of claim 8, wherein the plurality of metal redistribution layers comprises a first metal redistribution layer (RDL) via connected to the first metal interconnect line.

10. The semiconductor package of claim 9, wherein the plurality of metal redistribution layers comprises:
a first metal RDL via stack including the first metal RDL via; and
a second metal RDL via stack including a second metal RDL via connected to the first metal interconnect line.

11. The semiconductor package of claim 10, wherein the first metal RDL via is connected to a first end of the first metal interconnect line and the second metal RDL via is connected to a second end of the first metal interconnect line that is opposite the first end.

12. The semiconductor package of claim 8, wherein the the plurality of metal redistribution layers comprises a plurality of metal redistribution layer (RDL) via stacks, and
wherein the plurality of metal RDL via stacks comprises:
a first metal RDL via stack connected to a first end of the first metal interconnect line in the plurality of metal interconnect lines; and
a second metal RDL via stack connected to a second end of the first metal interconnect line that is opposite the first end.

13. The semiconductor package of claim 12, wherein the first metal RDL via stack is connected to the first semiconductor die and the second metal RDL via stack is connected to the second semiconductor die.

14. The semiconductor package of claim 12, wherein the plurality of metal RDL via stacks further comprises:
a third metal RDL via stack connected to a first end of a second metal interconnect line in the plurality of metal interconnect lines; and
a fourth metal RDL via stack connected to a second end of the second metal interconnect line that is opposite the first end of the second metal interconnect line.

15. The semiconductor package of claim 14, wherein the first metal interconnect line has a length that is greater than a length of the second metal interconnect line.

16. The semiconductor package of claim 8, wherein the plurality of inorganic dielectric layers further comprises a passivation layer that includes a metal-insulator-metal (MIM) capacitor.

17. A method of making a semiconductor package, the method comprising:
- forming a plurality of inorganic dielectric layers including a plurality of metal interconnect layers and a plurality of first contact pads comprising a damascene structure, wherein the plurality of inorganic dielectric layers comprises a first inorganic dielectric layer, a second inorganic dielectric layer on the first inorganic dielectric layer and a third inorganic dielectric layer on the second inorganic dielectric layer, the plurality of metal interconnect layers comprises a first metal interconnect layer in the first inorganic dielectric layer, a second metal interconnect layer in the second inorganic dielectric layer, and a third metal interconnect layer in the third inorganic dielectric layer, and the second metal interconnect layer is electrically coupled to a pair of first contact pads of the plurality of first contact pads on opposing sides of the third metal interconnect layer in the third inorganic dielectric layer;
- mounting a first semiconductor die on the plurality of inorganic dielectric layers such that the first semiconductor die is connected to the plurality of metal interconnect layers; and
- mounting a second semiconductor die on the plurality of inorganic dielectric layers such that the second semiconductor die is connected to the first semiconductor die by the plurality of metal interconnect layers.

18. The method of claim 17, further comprising:
- forming a plurality of organic dielectric layers on the plurality of inorganic dielectric layers,
- wherein the mounting of the first semiconductor die on the plurality of inorganic dielectric layers comprises mounting the first semiconductor die to the plurality of organic dielectric layers that are formed on the plurality of inorganic dielectric layers, and
- wherein the mounting of the second semiconductor die on the plurality of inorganic dielectric layers comprises mounting the second semiconductor die to the plurality of organic dielectric layers that are formed on the plurality of inorganic dielectric layers.

19. The method of claim 18, wherein the forming of the plurality of inorganic dielectric layers comprises forming the first metal interconnect line, and the forming of the plurality of organic dielectric layers comprises comprising a first metal redistribution layer (RDL) via connected to the first metal interconnect line, and
- wherein the plurality of metal redistribution layers comprises:
  - a first metal RDL via stack including the first metal RDL via; and
  - a second metal RDL via stack including a second metal RDL via connected to the first metal interconnect line.

20. The method of claim 19, wherein the forming of the plurality of organic dielectric layers comprises forming the first metal RDL via to be connected to a first end of the first metal interconnect line and forming the second metal RDL via to be connected to a second end of the first metal interconnect line that is opposite the first end.

* * * * *